United States Patent
Ng et al.

(10) Patent No.: US 12,135,437 B2
(45) Date of Patent: Nov. 5, 2024

(54) MEMS ACTUATOR SYSTEM

(71) Applicant: MEMS Drive (Nanjing) Co., Ltd., Nanjing (CN)

(72) Inventors: Matthew Ng, Rosemead, CA (US); Xiaolei Liu, South Pasadena, CA (US); Guiqin Wang, Arcadia, CA (US)

(73) Assignee: MEMS DRIVE (NANJING) CO., LTD., Nanjing (CN)

(*) Notice: Subject to any disclaimer, the term of this patent is extended or adjusted under 35 U.S.C. 154(b) by 778 days.

(21) Appl. No.: 17/025,147

(22) Filed: Sep. 18, 2020

(65) Prior Publication Data
US 2021/0088804 A1    Mar. 25, 2021

Related U.S. Application Data

(60) Provisional application No. 62/903,207, filed on Sep. 20, 2019.

(51) Int. Cl.
| | |
|---|---|
| *G02B 27/64* | (2006.01) |
| *H04N 23/68* | (2023.01) |
| *B81B 3/00* | (2006.01) |
| *H02K 41/035* | (2006.01) |
| *H02N 1/00* | (2006.01) |
| *H02N 2/02* | (2006.01) |

(52) U.S. Cl.
CPC ......... *G02B 27/646* (2013.01); *H04N 23/687* (2023.01); *B81B 3/0062* (2013.01); *B81B 2203/055* (2013.01); *H02K 41/0356* (2013.01); *H02K 2201/18* (2013.01); *H02N 1/008* (2013.01); *H02N 2/028* (2013.01)

(58) Field of Classification Search
CPC .................. G02B 27/64; G02B 27/646; G03B 2205/0007; H04N 23/68; H04N 23/682; H04N 23/685; H04N 23/687; H10N 30/2044; B81B 3/0062; B81B 2201/033; B81B 2203/051; B81B 2203/053; B81B 2203/055; H02K 41/0356; H02K 2201/18; H02N 1/008; H02N 1/028
See application file for complete search history.

(56) References Cited

U.S. PATENT DOCUMENTS

| | | | |
|---|---|---|---|
| 7,423,794 | B2 | 9/2008 | Elata et al. |
| 8,508,098 | B2 | 8/2013 | Lubianiker |
| 2011/0080627 | A1 | 4/2011 | He et al. |
| 2012/0119611 | A1* | 5/2012 | Jain ........................ G03B 3/10 438/430 |
| 2019/0104239 | A1* | 4/2019 | Aschwanden ..... H04N 23/6811 |
| 2019/0157988 | A1 | 5/2019 | Liu et al. |
| 2019/0227266 | A1 | 7/2019 | Wang et al. |

OTHER PUBLICATIONS

International Search Report issued in PCT Application Serial No. PCT/US2020/051476 on Dec. 18, 2020.

* cited by examiner

*Primary Examiner* — Clayton E. LaBalle
*Assistant Examiner* — Fang-Chi Chang
(74) *Attorney, Agent, or Firm* — Brian J. Colandreo; Jeffrey T. Placker; Holland & Knight LLP

(57) ABSTRACT

A multi-axis MEMS assembly is configured to provide multi-axis movement and includes: a first in-plane MEMS actuator configured to enable movement along at least an X-axis; and a second in-plane MEMS actuator configured to enable movement along at least a Y-axis; wherein the first in-plane MEMS actuator is coupled to the second in-plane MEMS actuator.

16 Claims, 19 Drawing Sheets

MEMS ACTUATOR SYSTEM

RELATED CASE(S)

This application claims the benefit of U.S. Provisional Application No. 62/903,207 filed on 20 Sep. 2019, the contents of which are incorporated herein by reference.

TECHNICAL FIELD

This disclosure relates to actuators in general and, more particularly, to miniaturized MEMS actuators configured for use within camera packages.

BACKGROUND

As is known in the art, actuators may be used to convert electronic signals into mechanical motion. In many applications such as e.g., portable devices, imaging-related devices, telecommunications components, and medical instruments, it may be beneficial for miniature actuators to fit within the small size, low power, and cost constraints of these application.

Micro-electrical-mechanical system (MEMS) technology is the technology that in its most general form may be defined as miniaturized mechanical and electro-mechanical elements that are made using the techniques of microfabrication. The critical dimensions of MEMS devices may vary from well below one micron to several millimeters. In general, MEMS actuators are more compact than conventional actuators, and they consume less power.

SUMMARY OF DISCLOSURE

In one implementation, a multi-axis MEMS assembly is configured to provide multi-axis movement, the multi-axis MEMS assembly and includes: a first in-plane MEMS actuator configured to enable movement along at least an X-axis; and a second in-plane MEMS actuator configured to enable movement along at least a Y-axis; wherein the first in-plane MEMS actuator is coupled to the second in-plane MEMS actuator.

One or more of the following features may be included. The first in-plane MEMS actuator may also be configured to enable movement along the Y-axis. The second in-plane MEMS actuator may also be configured to enable movement along the X-axis. The first in-plane MEMS actuator and the second in-plane MEMS actuator may form a stacked multi-axis micro-electrical-mechanical system (MEMS) actuator. One of the first in-plane MEMS actuator and the second in-plane MEMS actuator may be positioned on top of the other of the first in-plane MEMS actuator and the second in-plane MEMS actuator. The first in-plane MEMS actuator and the second in-plane MEMS actuator may form a cascaded multi-axis micro-electrical-mechanical system (MEMS) actuator. One of the first in-plane MEMS actuator and the second in-plane MEMS actuator is positioned next to the other of the first in-plane MEMS actuator and the second in-plane MEMS actuator. At least one or the first in-plane MEMS actuator and the second in-plane MEMS actuator may be an electrostatic MEMS actuator. At least one or the first in-plane MEMS actuator and the second in-plane MEMS actuator may be an electromagnetic MEMS actuator. At least one or the first in-plane MEMS actuator and the second in-plane MEMS actuator may be a piezoelectric MEMS actuator. At least one of the first in-plane MEMS actuator and the second in-plane MEMS actuator may be an image stabilization actuator. An optoelectronic device may be coupled to one of the first in-plane MEMS actuator and the second in-plane MEMS actuator.

In another implementation, a multi-axis MEMS assembly is configured to provide multi-axis movement, the multi-axis MEMS assembly and includes: a first in-plane MEMS actuator configured to enable movement along at least an X-axis; a second in-plane MEMS actuator configured to enable movement along at least a Y-axis; and an optoelectronic device coupled to one of the first in-plane MEMS actuator and the second in-plane MEMS actuator; wherein the first in-plane MEMS actuator is coupled to the second in-plane MEMS actuator; and wherein the first in-plane MEMS actuator and the second in-plane MEMS actuator form a stacked multi-axis micro-electrical-mechanical system (MEMS) actuator.

One or more of the following features may be included. At least one or the first in-plane MEMS actuator and the second in-plane MEMS actuator may be an electrostatic MEMS actuator. At least one or the first in-plane MEMS actuator and the second in-plane MEMS actuator may be an electromagnetic MEMS actuator. At least one or the first in-plane MEMS actuator and the second in-plane MEMS actuator may be a piezoelectric MEMS actuator.

In one implementation, a multi-axis MEMS assembly is configured to provide multi-axis movement, the multi-axis MEMS assembly and includes: a first in-plane MEMS actuator configured to enable movement along at least an X-axis; a second in-plane MEMS actuator configured to enable movement along at least a Y-axis; and an optoelectronic device coupled to one of the first in-plane MEMS actuator and the second in-plane MEMS actuator; wherein the first in-plane MEMS actuator is coupled to the second in-plane MEMS actuator; and wherein the first in-plane MEMS actuator and the second in-plane MEMS actuator form a cascaded multi-axis micro-electrical-mechanical system (MEMS) actuator.

One or more of the following features may be included. At least one or the first in-plane MEMS actuator and the second in-plane MEMS actuator may be an electrostatic MEMS actuator. At least one or the first in-plane MEMS actuator and the second in-plane MEMS actuator may be an electromagnetic MEMS actuator. At least one or the first in-plane MEMS actuator and the second in-plane MEMS actuator may be a piezoelectric MEMS actuator.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
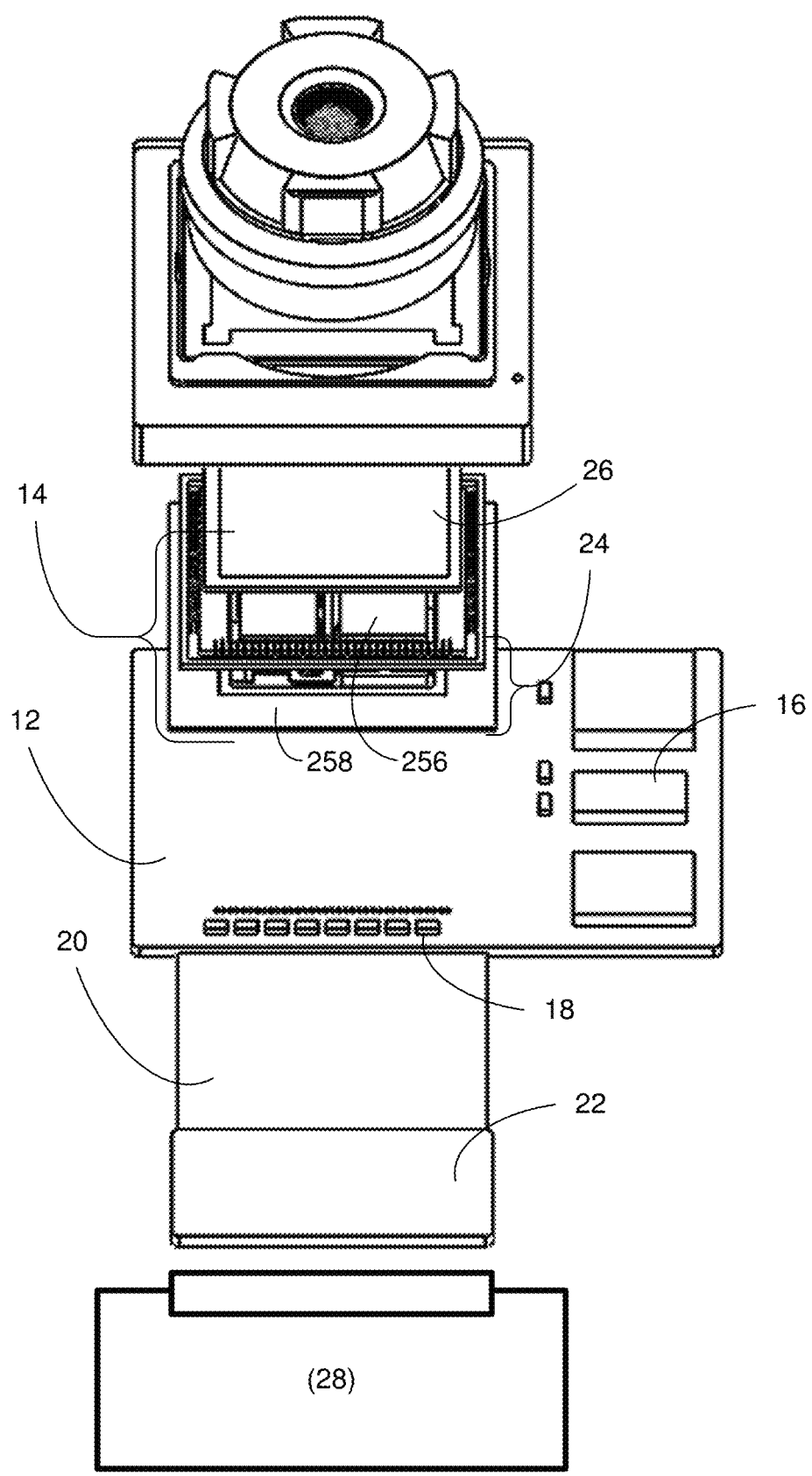
FIG. 1 is a perspective view of a MEMS package in accordance with various embodiments of the present disclosure.

System Overview:

Referring to FIG. 1, there is shown MEMS package 10, in accordance with various aspects of this disclosure. In this example, MEMS package 10 is shown to include printed circuit board 12, multi-axis MEMS assembly 14, driver circuits 16, electronic components 18, flexible circuit 20, and electrical connector 22. Multi-axis MEMS assembly 14 may include micro-electrical-mechanical system (MEMS) actuator 24 (configured to provide linear three-axis movement) and optoelectronic device 26 coupled to micro-electrical-mechanical system (MEMS) actuator 24.

As will be discussed below in greater detail, examples of micro-electrical-mechanical system (MEMS) actuator 24 may include but are not limited to an in-plane MEMS actuator, an out-of-plane MEMS actuator, and a combination in-plane/out-of-plane MEMS actuator. For example and if micro-electrical-mechanical system (MEMS) actuator 24 is an in-plane MEMS actuator, the in-plane MEMS actuator may include an electrostatic comb drive actuation system (as will be discussed below in greater detail). Additionally, if micro-electrical-mechanical system (MEMS) actuator 24 is an out-of-plane MEMS actuator, the out-of-plane MEMS actuator may include a piezoelectric actuation system or electrostatic actuation. And if micro-electrical-mechanical system (MEMS) actuator 24 is a hybrid in-plane/out-of-plane MEMS actuator, the combination in-plane/out-of-plane MEMS actuator may include an electrostatic comb drive actuation system and a piezoelectric actuation system.

As will be discussed below in greater detail, examples of optoelectronic device 26 may include but are not limited to an image sensor, a holder assembly, a UV filter and/or a lens assembly. Examples of electronic components 18 may include but are not limited to various electronic or semiconductor components and devices. Flexible circuit 20 and/or connector 22 may be configured to electrically couple MEMS package 10 to e.g., a smart phone or a digital camera (represented as generic item 28).

As will be discussed below in greater detail, micro-electrical-mechanical system (MEMS) actuator 24 may be sized so that it may fit within a recess in printed circuit board 12. The depth of this recess within printed circuit board 12 may vary depending upon the particular embodiment and the physical size of micro-electrical-mechanical system (MEMS) actuator 24.

In some embodiments, some of the components of MEMS package 10 may be joined together using various epoxies/adhesives. For example, an outer frame of micro-electrical-mechanical system (MEMS) actuator 24 may include contact pads that may correspond to similar contact pads on printed circuit board 12.

Figure 2A:
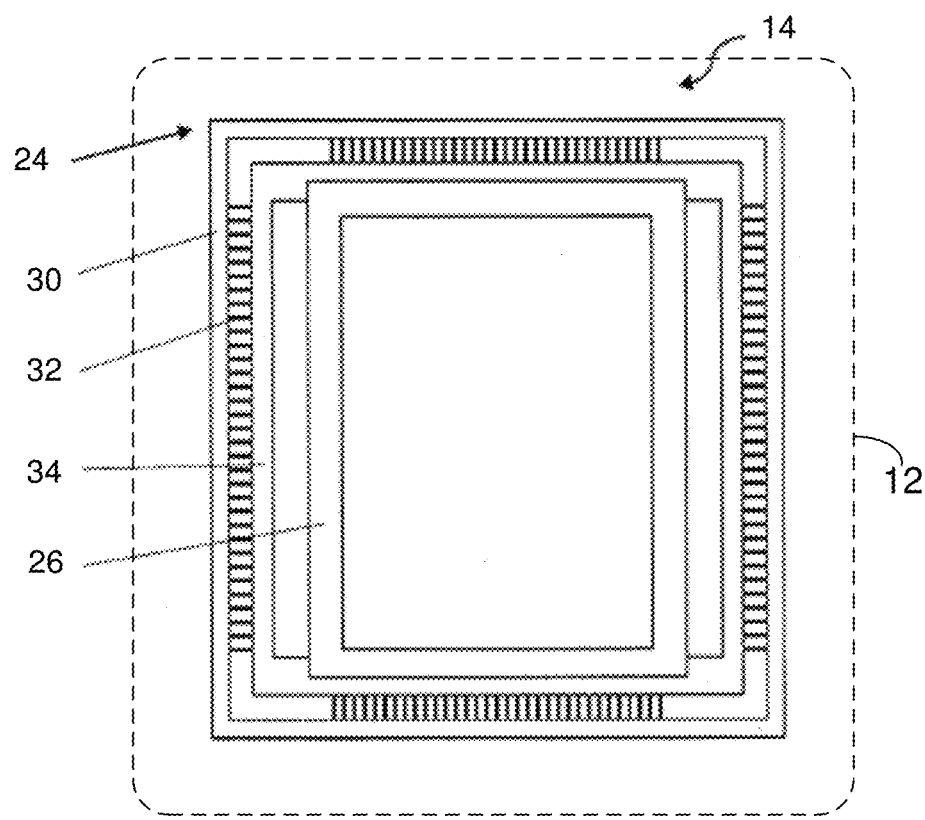
FIG. 2A is a diagrammatic view of an in-plane MEMS actuator with the optoelectronic device in accordance with various embodiments of the present disclosure.

Referring also to FIG. 2A, there is shown multi-axis MEMS assembly 14, which may include optoelectronic device 26 coupled to micro-electrical-mechanical system (MEMS) actuator 24. As discussed above, examples of micro-electrical-mechanical system (MEMS) actuator 24 may include but are not limited to an in-plane MEMS actuator, an out-of-plane MEMS actuator, and a combination in-plane/out-of-plane MEMS actuator.

When configured to provide in-plane actuation functionality, micro-electrical-mechanical system (MEMS) actuator 24 may include outer frame 30, plurality of electrically conductive flexures 32, MEMS actuation core 34 for attaching a payload (e.g., a device), and attached optoelectronic device 26. Optoelectronic device 26 may be coupled to MEMS actuation core 34 of micro-electrical-mechanical system (MEMS) actuator 24 by epoxy (or various other adhesives/materials and/or bonding methods).

Figure 2B:
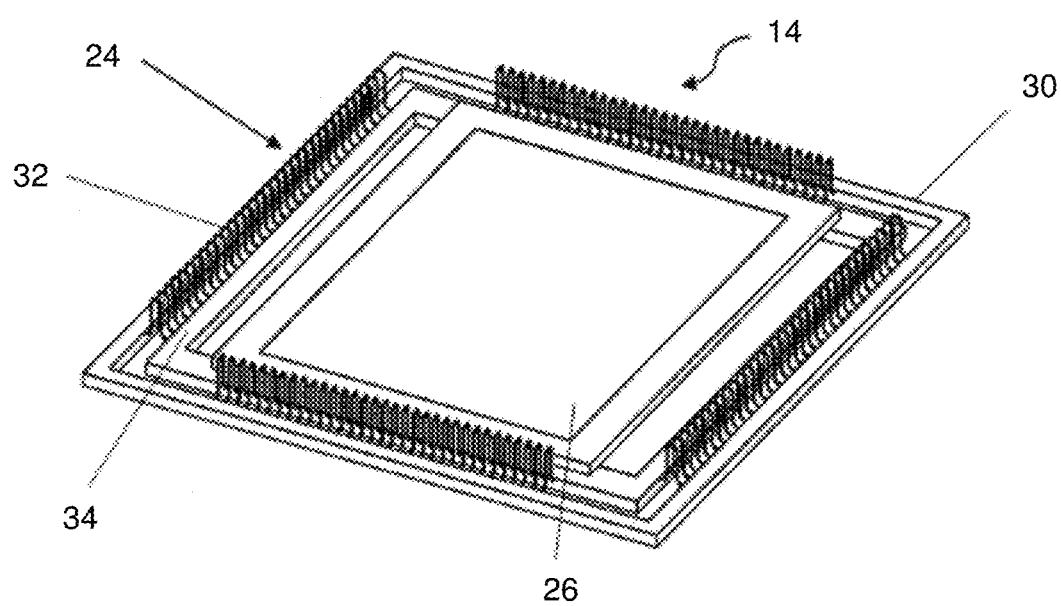
FIG. 2B is a perspective view of an in-plane MEMS actuator with the optoelectronic device in accordance with various embodiments of the present disclosure.

Referring also to FIG. 2B, plurality of electrically conductive flexures 32 of micro-electrical-mechanical system (MEMS) actuator 24 may be curved upward and buckled to achieve the desired level of flexibility. In the illustrated embodiment, plurality of electrically conductive flexures 32 may have one end attached to MEMS actuation core 34 (e.g., the moving portion of micro-electrical-mechanical system (MEMS) actuator 24) and the other end attached to outer frame 30 (e.g., the fixed portion of micro-electrical-mechanical system (MEMS) actuator 24).

Plurality of electrically conductive flexures 32 may be conductive wires that may extend above the plane (e.g., an upper surface) of micro-electrical-mechanical system (MEMS) actuator 24 and may electrically couple laterally separated components of micro-electrical-mechanical system (MEMS) actuator 24. For example, plurality of electrically conductive flexures 32 may provide electrical signals from optoelectronic device 26 and/or MEMS actuation core 34 to outer frame 30 of micro-electrical-mechanical system (MEMS) actuator 24. As discussed above, outer frame 30 of micro-electrical-mechanical system (MEMS) actuator 24 may be affixed to circuit board 12 using epoxy (or various other adhesive materials or devices).

Figure 3:
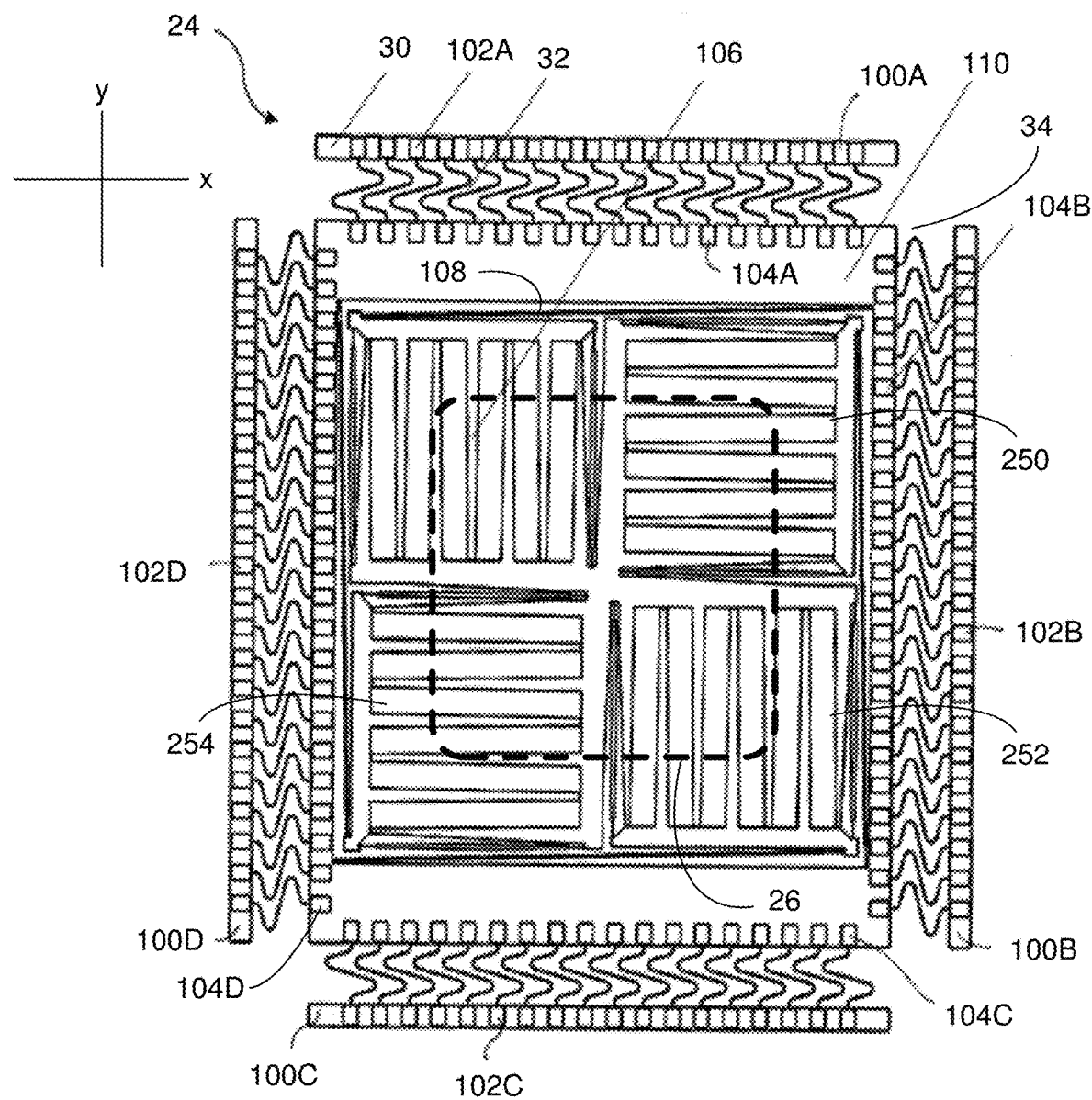
FIG. 3 is a diagrammatic view of an in-plane MEMS actuator in accordance with various embodiments of the present disclosure.

Referring also to FIG. 3, there is shown a top view of micro-electrical-mechanical system (MEMS) actuator 24 in accordance with various embodiments of the disclosure. Outer frame 30 is shown to include (in this example) four frame assemblies (e.g., frame assembly 100A, frame assembly 100B, frame assembly 100C, frame assembly 100D) that are shown as being spaced apart to allow for additional detail.

Outer frame 30 of micro-electrical-mechanical system (MEMS) actuator 24 may include a plurality of contact pads (e.g., contact pads 102A on frame assembly 100A, contact pads 102B on frame assembly 100B, contact pads 102C on frame assembly 100C, and contact pads 102D on frame assembly 100D), which may be electrically coupled to one end of plurality of electrically conductive flexures 32. The curved shape of electrically conductive flexures 32 is provided for illustrative purposes only and, while illustrating one possible embodiment, other configurations are possible and are considered to be within the scope of this disclosure.

MEMS actuation core 34 may include a plurality of contact pads (e.g., contact pads 104A, contact pads 104B, contact pads 104C, contact pads 104D), which may be electrically coupled to the other end of plurality of electrically conductive flexures 32. A portion of the contact pads (e.g., contact pads 104A, contact pads 104B, contact pads 104C, contact pads 104D) of MEMS actuation core 34 may be electrically coupled to optoelectronic device 26 by wire bonding, silver paste, or eutectic seal, thus allowing for the electrical coupling of optoelectronic device 26 to outer frame 30.

Electrostatic Actuation

MEMS actuation core 34 may include one or more comb drive sectors (e.g., comb drive sector 106) that are actuation sectors disposed within micro-electrical-mechanical system (MEMS) actuator 24. The comb drive sectors (e.g., comb drive sector 106) within MEMS actuation core 34 may be disposed in the same plane and may be positioned orthogonal to each other to allow for movement in two axes (e.g., the X-axis and the Y-axis). Accordingly, the in-plane MEMS actuator generally (and MEMS actuation core 34 specifically) may be configured to provide linear X-axis movement and linear Y-axis movement.

While in this particular example, MEMS actuation core 34 is shown to include four comb drive sectors, this is for illustrative purposes only and is not intended to be a limitation of this disclosure, as other configurations are possible. For example, the number of comb drive sectors may be increased or decreased depending upon design criteria.

While in this particular example, the four comb drive sectors are shown to be generally square in shape, this is for illustrative purposes only and is not intended to be a limitation of this disclosure, as other configurations are possible. For example, the shape of the comb drive sectors may be changed to meet various design criteria.

While the comb drive sectors (e.g., comb drive sector 106) within MEMS actuation core 34 are shown to be positioned orthogonal to each other to allow for movement in two axes (e.g., the X-axis and the Y-axis), this is for illustrative purposes only and is not intended to be a limitation of this disclosure, as other configurations are possible. For example, the comb drive sectors (e.g., comb drive sector 106) within MEMS actuation core 34 may be positioned parallel to each other to allow for movement in a single axis (e.g., either the X-axis or the Y-axis).

Each comb drive sector (e.g., comb drive sector 106) within MEMS actuation core 34 may include one or more moving portions and one or more fixed portions. As will be discussed below in greater detail, a comb drive sector (e.g., comb drive sector 106) within MEMS actuation core 34 may be coupled, via a cantilever assembly (e.g., cantilever assembly 108), to outer periphery 110 of MEMS actuation core 34 (i.e., the portion of MEMS actuation core 34 that includes contact pads 104A, contact pads 104B, contact pads 104C, contact pads 104D), which is the portion of MEMS actuation core 34 to which optoelectronic device 26 may be coupled, thus effectuating the transfer of movement to optoelectronic device 26.

Figure 4:
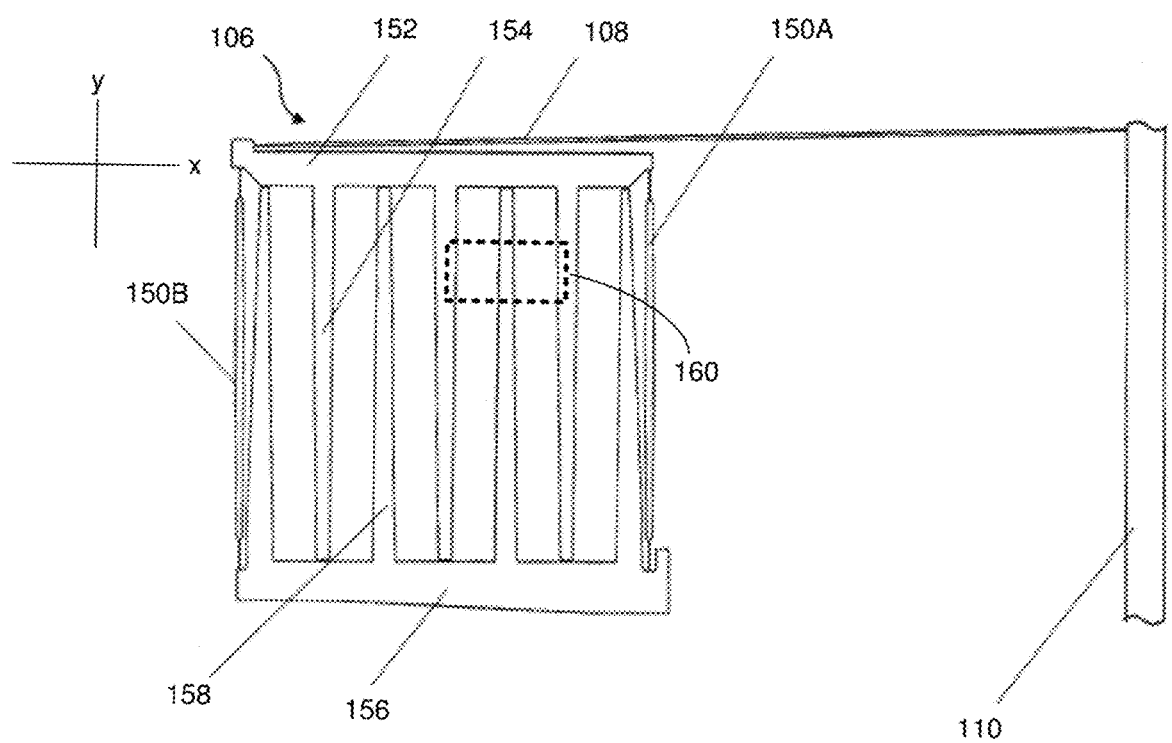
FIG. 4 is a diagrammatic view of a comb drive sector in accordance with various embodiments of the present disclosure.

Referring also to FIG. 4, there is shown a top view of comb drive sector 106 in accordance with various embodiments of the present disclosure. Each comb drive sector (e.g., comb drive sector 106) may include one or more motion control cantilever assemblies (e.g., motion control cantilever assemblies 150A, 150B) positioned outside of comb drive sector 106, moveable frame 152, moveable spines 154, fixed frame 156, fixed spines 158, and cantilever assembly 108 that is configured to couple moving frame 152 to outer periphery 110 of MEMS actuation core 34. In this particular configuration, motion control cantilever assemblies 150A, 150B may be configured to prevent Y-axis displacement between moving frame 152/moveable spines 154 and fixed frame 156/fixed spines 158.

Comb drive sector 106 may include a movable member including moveable frame 152 and multiple moveable spines 154 that are generally orthogonal to moveable frame 152. Comb drive sector 106 may also include a fixed member including fixed frame 156 and multiple fixed spines 158 that are generally orthogonal to fixed frame 156. Cantilever assembly 108 may be deformable in one direction (e.g., in response to Y-axis deflective loads) and rigid in another direction (e.g., in response to X-axis tension and compression loads), thus allowing for cantilever assembly 108 to absorb motion in the Y-axis but transfer motion in the X-axis.

Figure 5:
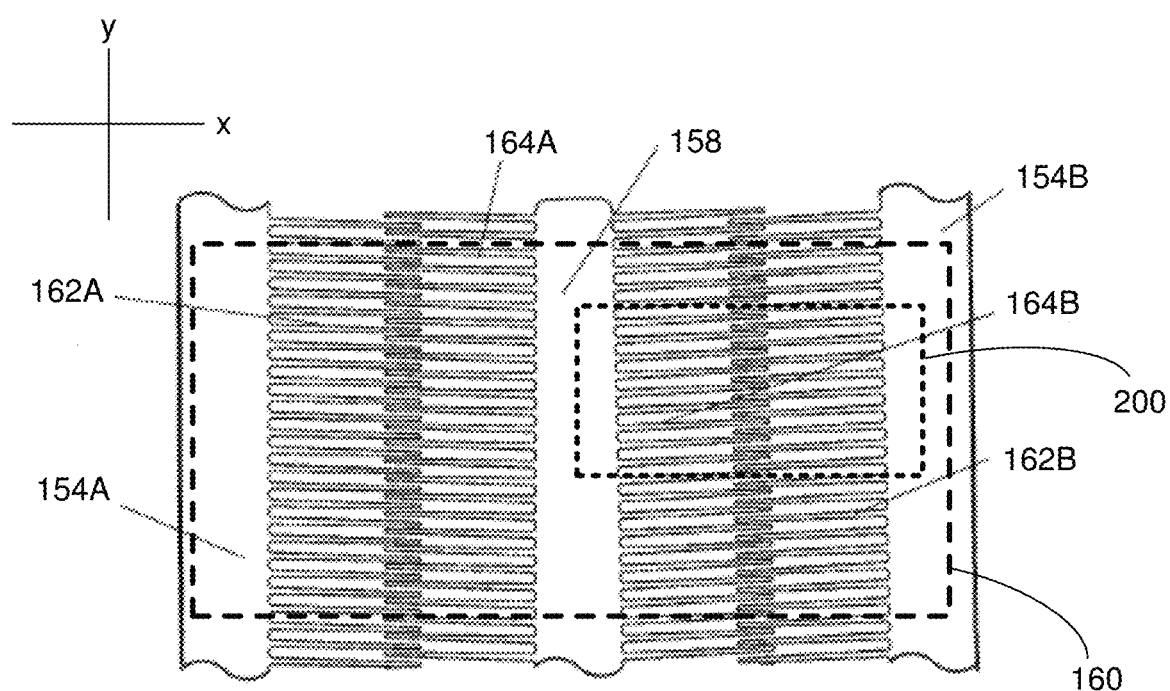
FIG. 5 is a diagrammatic view of a comb pair in accordance with various embodiments of the present disclosure.

Referring also to FIG. 5, there is shown a detail view of portion 160 of comb drive sector 106. Moveable spines 154A, 154B may include a plurality of discrete moveable actuation fingers that are generally orthogonally-attached to moveable spines 154A, 154B. For example, moveable spine 154A is shown to include moveable actuation fingers 162A and moveable spine 154B is shown to include moveable actuation fingers 162B.

Further, fixed spine 158 may include a plurality of discrete fixed actuation fingers that are generally orthogonally-attached to fixed spine 158. For example, fixed spine 158 is shown to include fixed actuation fingers 164A that are configured to mesh and interact with moveable actuation fingers 162A. Further, fixed spine 158 is shown to include fixed actuation fingers 164B that are configured to mesh and interact with moveable actuation fingers 162B.

Accordingly, various numbers of actuation fingers may be associated with (i.e. coupled to) the moveable spines (e.g., moveable spines 154A, 154B) and/or the fixed spines (e.g., fixed spine 158) of comb drive sector 106. As discussed above, each comb drive sector (e.g., comb drive sector 106) may include two motion control cantilever assemblies 150A, 150B separately placed on each side of comb drive sector 106. Each of the two motion control cantilever assemblies 150A, 150B may be configured to couple moveable frame 152 and fixed frame 156, as this configuration enables moveable actuation fingers 162A, 162B to be displaceable in the X-axis with respect to fixed actuation fingers 164A, 164B (respectively) while preventing moveable actuation fingers 162A, 162B from being displaced in the Y-axis and contacting fixed actuation fingers 164A, 164B (respectively).

While actuation fingers 162A, 162B, 164A, 164B (or at least the center axes of actuation fingers 162A, 162B, 164A, 164B) are shown to be generally parallel to one another and generally orthogonal to the respective spines to which they are coupled, this is for illustrative purposes only and is not intended to be a limitation of this disclosure, as other configurations are possible. Further and in some embodiments, actuation fingers 162A, 162B, 164A, 164B may have the same width throughout their length and in other embodiments, actuation fingers 162A, 162B, 164A, 164B may be tapered.

Further and in some embodiments, moveable frame 152 may be displaced in the positive X-axis direction when a voltage potential is applied between actuation fingers 162A and actuation fingers 164A, while moveable frame 152 may be displaced in the negative X-axis direction when a voltage potential is applied between actuation fingers 162B and actuation fingers 164B.

Figure 6:
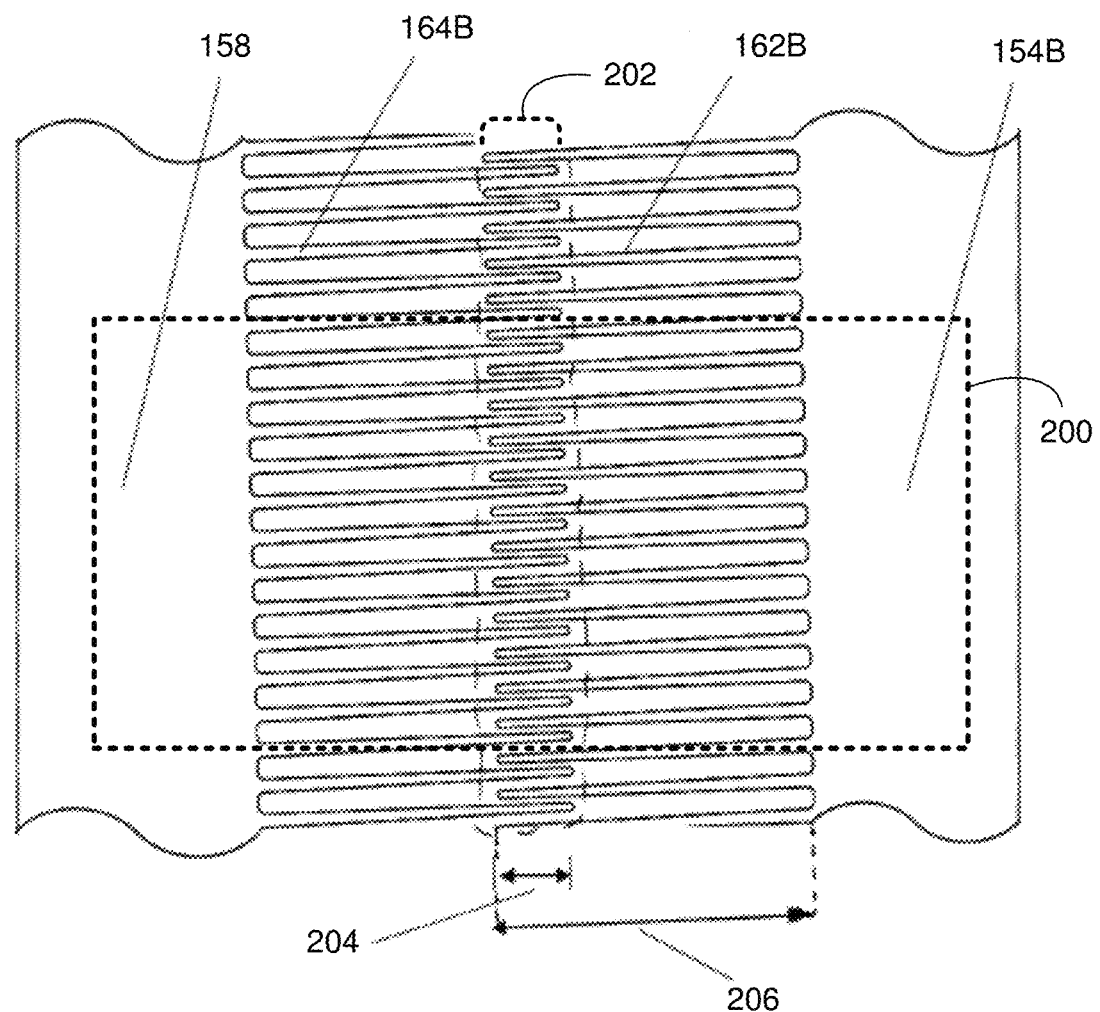
FIG. 6 is a diagrammatic view of fingers of the comb pair of FIG. 5 in accordance with various embodiments of the present disclosure.

Referring also to FIG. 6, there is shown a detail view of portion 200 of comb drive sector 106. Fixed spine 158 may be generally parallel to moveable spine 154B, wherein actuation fingers 164B and actuation fingers 162B may overlap within region 202, wherein the width of overlap region 202 is typically in the range of 10-50 microns. While overlap region 202 is described as being in the range of 10-50 microns, this is for illustrative purposes only and is not intended to be a limitation of this disclosure, as other configurations are possible.

Overlap region 202 may represent the distance 204 where the ends of actuation fingers 162B extends past and overlap the ends of actuation fingers 164B, which are interposed therebetween. In some embodiments, actuation fingers 162B and actuation fingers 164B may be tapered such that their respective tips are narrower than their respective bases (i.e., where they are attached to their spines). As is known in the art, various degrees of taper may be utilized with respect to actuation fingers 162B and actuation fingers 164B. Additionally, the overlap of actuation fingers 162B and actuation fingers 164B provided by overlap region 202 may help ensure that there is sufficient initial actuation force when an electrical voltage potential is applied so that MEMS actuation core 34 may move gradually and smoothly without any sudden jumps with varying the applied voltage. The height of actuation fingers 162B and actuation fingers 164B may be determined by various aspects of the MEMS fabrication process and various design criteria.

Length 206 of actuation fingers 162B and actuation fingers 164B, the size of overlap region 202, the gaps between adjacent actuation fingers, and actuation finger taper angles that are incorporated into various embodiments may be determined by various design criteria, application considerations, and manufacturability considerations, wherein these measurements may be optimized to achieve the required displacement utilizing the available voltage potential.

As shown in FIG. 3 and as discussed above, MEMS actuation core 34 may include one or more comb drive sectors (e.g., comb drive sector 106), wherein the comb drive sectors (e.g., comb drive sector 106) within MEMS actuation core 34 may be disposed in the same plane and may be positioned orthogonal to each other to allow for movement in two axes (e.g., the X-axis and the Y-axis).

Specifically and in this particular example, MEMS actuation core 34 is shown to include four comb drive sectors (e.g., comb drive sectors 106, 250, 252, 254). As discussed above, comb drive sector 106 is configured to allow for movement along the X-axis, while preventing movement along the Y-axis. As comb drive sector 252 is similarly configured, comb drive sector 252 may allow for movement along the X-axis, while preventing movement along the Y-axis. Accordingly, if a signal is applied to comb drive sector 106 that provides for positive X-axis movement, while a signal is applied to comb drive sector 252 that provides for negative X-axis movement, actuation core 34 may be displaced in a clockwise direction. Conversely, if a signal is applied to comb drive sector 106 that provides for negative X-axis movement, while a signal is applied to comb drive sector 252 that provides for positive X-axis movement, actuation core 34 may be displaced in a counterclockwise direction.

Further, comb drive sectors 250, 254 are configured (in this example) to be orthogonal to comb drive sectors 106, 252. Accordingly, comb drive sectors 250, 254 may be configured to allow for movement along the Y-axis, while preventing movement along the X-axis. Accordingly, if a signal is applied to comb drive sector 250 that provides for positive Y-axis movement, while a signal is applied to comb drive sector 254 that provides for negative Y-axis movement, actuation core 34 may be displaced in a counterclockwise direction. Conversely, if a signal is applied to comb drive sector 250 that provides for negative Y-axis movement, while a signal is applied to comb drive sector 254 that provides for positive Y-axis movement, actuation core 34 may be displaced in a clockwise direction.

Accordingly, the in-plane MEMS actuator generally (and MEMS actuation core 34 specifically) may be configured to provide rotational (e.g., clockwise or counterclockwise) Z-axis movement Piezoelectric Actuation As stated above, examples of micro-electrical-mechanical system (MEMS) actuator 24 may include but are not limited to an in-plane MEMS actuator, an out-of-plane MEMS actuator, and a combination in-plane/out-of-plane MEMS actuator. For example and referring also to FIGS. 7A-7C, micro-electrical-mechanical system (MEMS) actuator 24 is shown to include an in-plane MEMS actuator (e.g., in-plane MEMS actuator 256) and an out-of-plane MEMS actuator (e.g., out-of-plane MEMS actuator 258), wherein FIGS. 3-6 illustrate one possible embodiment of in-plane MEMS actuator 256. Optoelectronic device 26 may be coupled to in-plane MEMS actuator 256; and in-plane MEMS actuator 256 may be coupled to out-of-plane MEMS actuator 258.

An example of in-plane MEMS actuator 256 may include but is not limited to an image stabilization actuator. As is known in the art, image stabilization is a family of techniques that reduce blurring associated with the motion of a camera or other imaging device during exposure. Generally, it compensates for pan and tilt (angular movement, equivalent to yaw and pitch) of the imaging device, though electronic image stabilization may also compensate for rotation. Image stabilization may be used in image-stabilized binoculars, still and video cameras, astronomical telescopes, and smartphones. With still cameras, camera shake may be a particular problem at slow shutter speeds or with long focal length (telephoto or zoom) lenses. With video cameras, camera shake may cause visible frame-to-frame jitter in the recorded video. In astronomy, the problem may be amplified by variations in the atmosphere (which changes the apparent positions of objects over time).

An example of out-of-plane MEMS actuator 258 may include but is not limited to an autofocus actuator. As is known in the art, an autofocus system may use a sensor, a control system and an actuator to focus on an automatically (or manually) selected area. Autofocus methodologies may be distinguished by their type (e.g., active, passive or hybrid). Autofocus systems may rely on one or more sensors to determine correct focus, wherein some autofocus systems may rely on a single sensor while others may use an array of sensors.

Figure 7A:
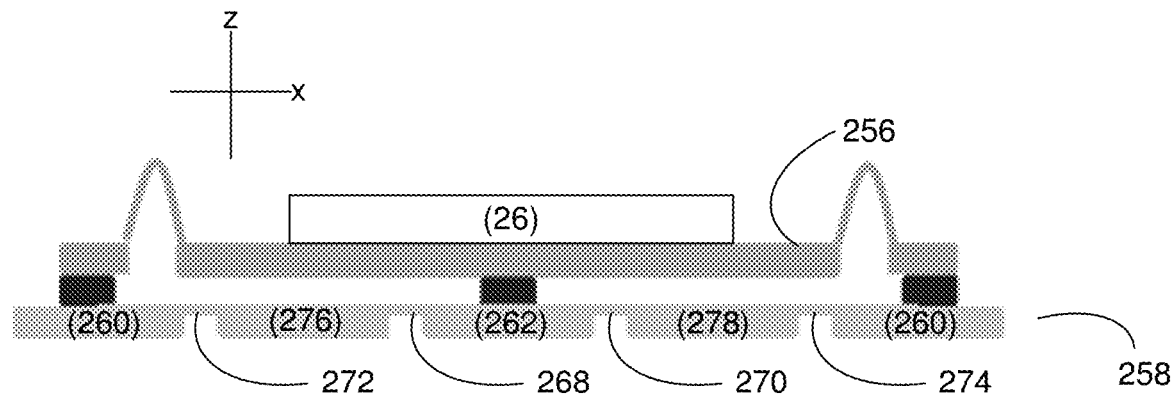
FIGS. 7A-7C are diagrammatic views of a piezoelectric out-of-plane actuator in accordance with various embodiments of the present disclosure.
Figure 7B:
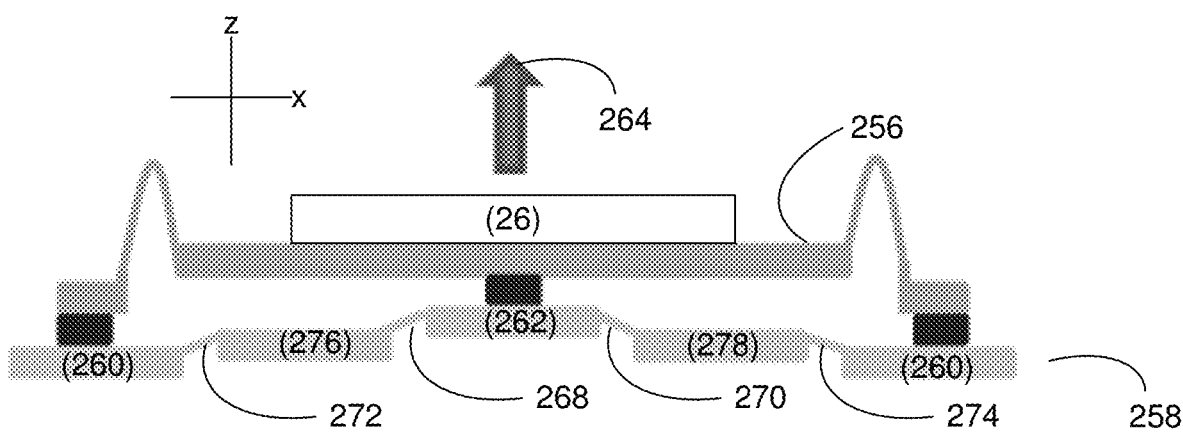
Figure 7C:
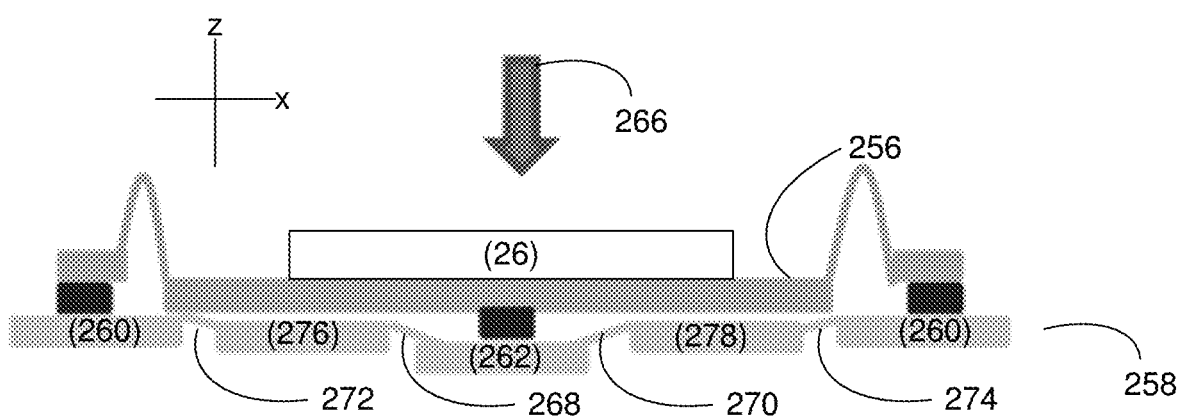

FIGS. 7A-7C show one possible embodiment of out-of-plane MEMS actuator 258 in various states of activation/excitation. Out-of-plane MEMS actuator 258 may include frame 260 (which is configured to be stationary) and moveable stage 262, wherein out-of-plane MEMS actuator 258 may be configured to provide linear Z-axis movement. For example, out-of-plane MEMS actuator 258 may include a multi-morph piezoelectric actuator that may be selectively and controllably deformable when an electrical charge is applied, wherein the polarity of the applied electrical charge may vary the direction in which the multi-morph piezoelectric actuator (i.e., out-of-plane MEMS actuator 258) is deformed. For example, FIG. 7A shows out-of-plane MEMS actuator 258 in a natural position without an electrical charge being applied. Further, FIG. 7B shows out-of-plane MEMS actuator 258 in an extended position (i.e., displaced in the direction of arrow 264) with an electrical charge having a first polarity being applied, while FIG. 7C shows out-of-plane MEMS actuator 258 in a retracted position (i.e., displaced in the direction of arrow 266) with an electrical charge having an opposite polarity being applied.

As discussed above, the multi-morph piezoelectric actuator (i.e., out-of-plane MEMS actuator 258) may be deformable by applying an electrical charge. In order to accomplish such deformability that allows for such linear Z-axis movement, the multi-morph piezoelectric actuator (i.e., out-of-plane MEMS actuator 258) may include a bending piezoelectric actuator.

Figure 8:
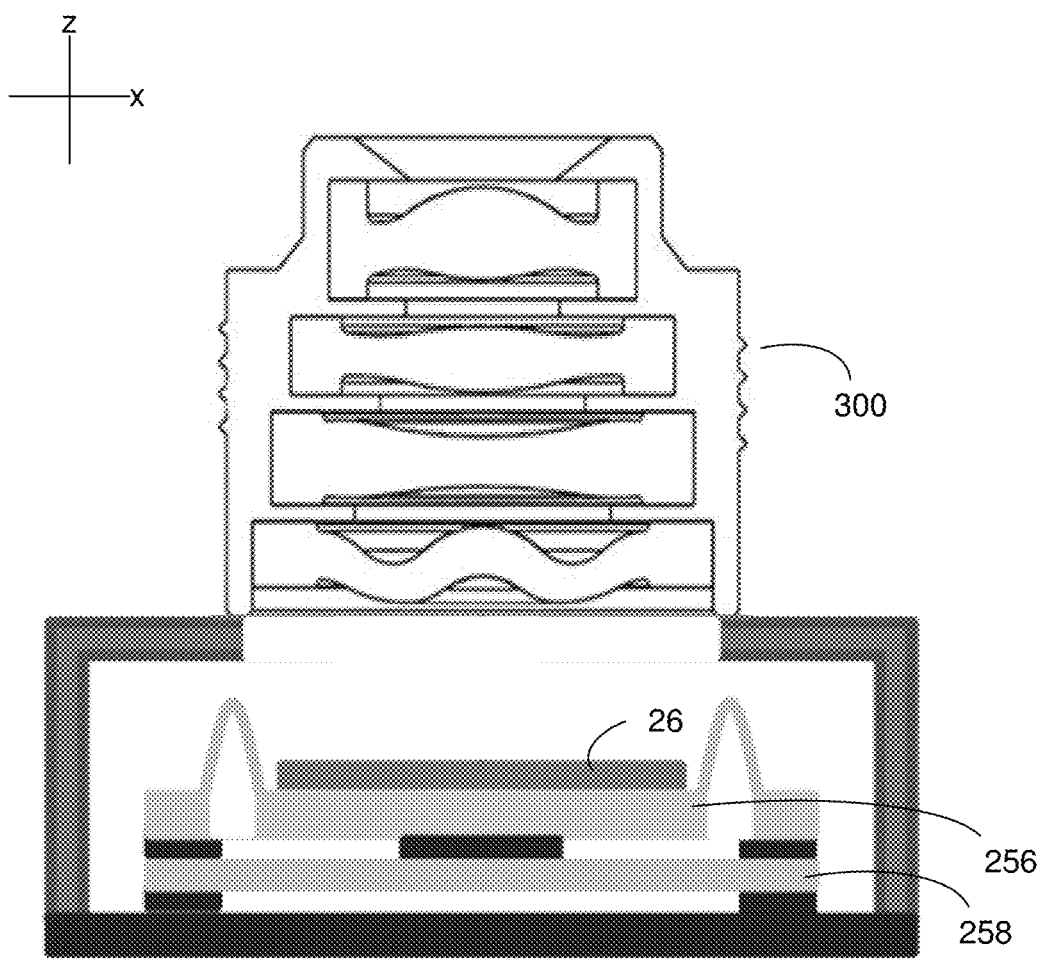
FIG. 8 is a diagrammatic view of a MEMS package in accordance with various embodiments of the present disclosure.

As discussed above, the multi-morph piezoelectric actuator (i.e., out-of-plane MEMS actuator 258) may include rigid frame assembly 260 (which is configured to be stationary) and moveable stage 262 that may be configured to be affixed to in-plane MEMS actuator 256. As discussed above, optoelectronic device 26 may be coupled to in-plane MEMS actuator 256 and in-plane MEMS actuator 256 may be coupled to out-of-plane MEMS actuator 258. Accordingly and when out-of-plane MEMS actuator 258 is in an extended position (i.e., displaced in the direction of arrow 264) with an electrical charge having a first polarity being applied (as shown in FIG. 7B), optoelectronic device 26 may be displaced in the positive z-axis direction and towards a lens assembly (e.g., lens assembly 300, FIG. 8). Alternatively and when out-of-plane MEMS actuator 258 is in a retracted position (i.e., displaced in the direction of arrow 266) with an electrical charge having an opposite polarity being applied (as shown in FIG. 7C), optoelectronic device 26 may be displaced in the negative z-axis direction and away from a lens assembly (e.g., lens assembly 300, FIG. 8). Accordingly and by displacing optoelectronic device 26 in the z-axis with respect to a lens assembly (e.g., lens assembly 300, FIG. 8), autofocus functionality may be achieved.

The multi-morph piezoelectric actuator (i.e., out-of-plane MEMS actuator 258) may include at least one deformable piezoelectric portion (e.g., deformable piezoelectric portions 268, 270, 272, 274) configured to couple moveable stage 262 to rigid frame assembly 260.

For example and in one particular embodiment, multi-morph piezoelectric actuator (i.e., out-of-plane MEMS actuator 258) may include a rigid intermediate stage (e.g., rigid intermediate stages 276, 278). A first deformable piezoelectric portion (e.g., deformable piezoelectric portions 268, 270) may be configured to couple rigid intermediate stage (e.g., rigid intermediate stages 276, 278) to moveable stage 262; and a second deformable piezoelectric portion (e.g., deformable piezoelectric portions 272, 274) may be configured to couple the rigid intermediate stage (e.g., rigid intermediate stages 276, 278) to rigid frame assembly 260.

Linear Z-axis (i.e., out-of-plane) movement of moveable stage 262 of out-of-plane MEMS actuator 258 may be generated due to the deformation of the deformable piezoelectric portion (e.g., deformable piezoelectric portions 268, 270, 272, 274), which may be formed of a piezoelectric material (e.g., PZT (lead zirconate titanate), zinc oxide or other suitable material) that may be configured to deflect in response to an electrical signal. As is known in the art, piezoelectric materials are a special type of ceramic that expands or contracts when an electrical field is applied, thus generating motion and force.

While out-of-plane MEMS actuator 258 is described above as including a single moveable stage (e.g., moveable stage 262) that enables linear movement in the Z-axis, this is for illustrative purposes only and is not intended to be a limitation of this disclosure, as other configurations are possible and are considered to be within the scope of this disclosure. For example, out-of-plane MEMS actuator 258 may be configured to include multiple moveable stages. For example, if rigid intermediate stages 276, 278 were configured to be separately controllable, additional degrees of freedom (such as tip and/or tilt) may be achievable. For example and in such a configuration, displacing intermediate stage 276 in an upward direction (i.e., in the direction of arrow 264) while displacing intermediate stage 278 in a downward direction (i.e., in the direction of arrow 266) would result in clockwise rotation of optoelectronic device 26 about the Y-axis; while displacing intermediate stage 276 in a downward direction (i.e., in the direction of arrow 266) while displacing intermediate stage 278 in a upward direction (i.e., in the direction of arrow 264) would result in counterclockwise rotation of optoelectronic device 26 about the Y-axis. Additionally/alternatively, corresponding clockwise and counterclockwise of optoelectronic device 26 about the X-axis may be achieved via additional/alternative intermediate stages.

Figure 7D:
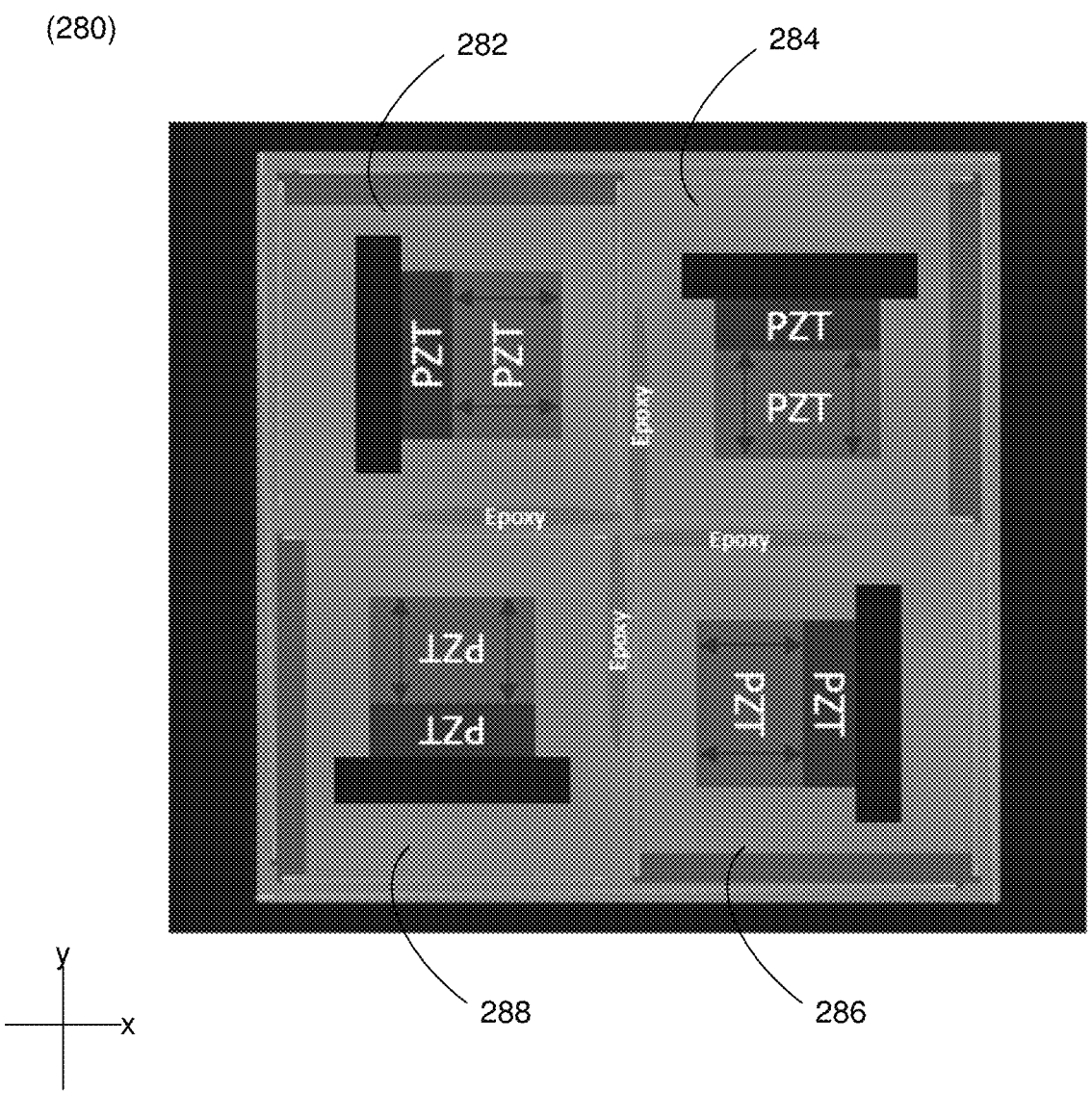
FIG. 7D is a diagrammatic view of a piezoelectric in-plane actuator in accordance with various embodiments of the present disclosure.

While FIGS. 7A-7C each show one possible embodiment of an out-of-plane piezoelectric MEMS actuator in various states of activation/excitation, this is for illustrative purposes only and is not intended to be a limitation of this disclosure, as other configurations are possible and are considered to be within the scope of this disclosure. For example and as shown in FIG. 7D, in-plane piezoelectric MEMS actuator 280 may be formed in a fashion similar to that of the above-described in-plane electrostatic MEMS actuators. Accordingly, in-plane piezoelectric MEMS actuator 280 may include a plurality of piezoelectric drive sectors (e.g., piezoelectric drive sectors 282, 284, 286, 288) configured in a similar orthogonal fashion (e.g., piezoelectric drive sectors 282, 286 being configured to enable movement in one axis and piezoelectric drive sectors 284, 288 being configured to enable movement in an orthogonal axis), thus enabling movement in the X-axis and the Y-axis, and rotation about the Z-axis.

Electromagnetic Actuation:

While in-plane MEMS actuator 256 is described above as being 100% MEMS based, this is for illustrative purposes only and is not intended to be a limitation of this disclosure, as other configurations are possible and are considered to be within the scope of this disclosure. For example and as will be discussed below, in-plane MEMS actuator 256 may include an electromagnetic actuator portion.

Figure 9:
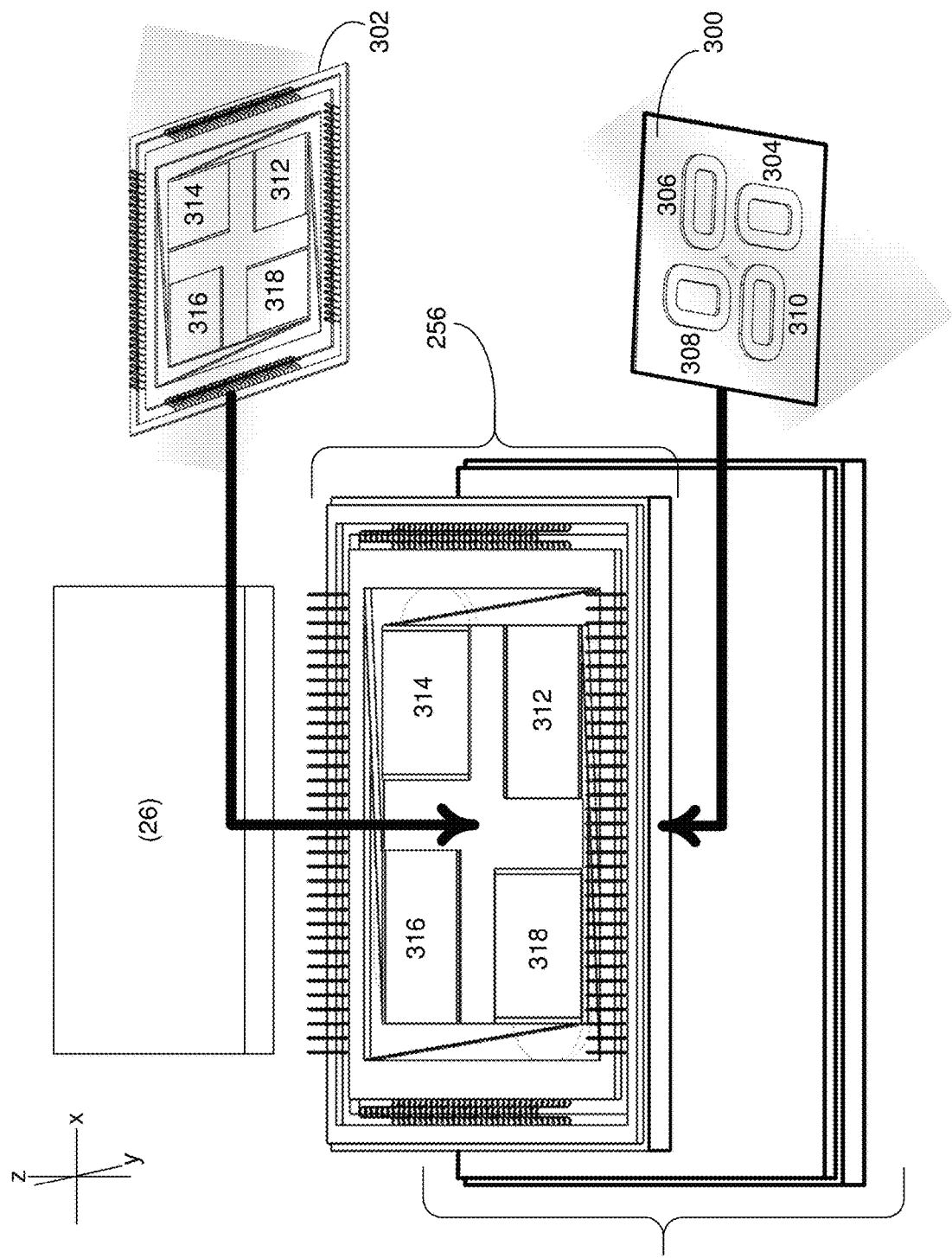
FIGS. 9-10 are diagrammatic views of an electromagnetic MEMS actuator in accordance with various embodiments of the present disclosure.
Figure 10:
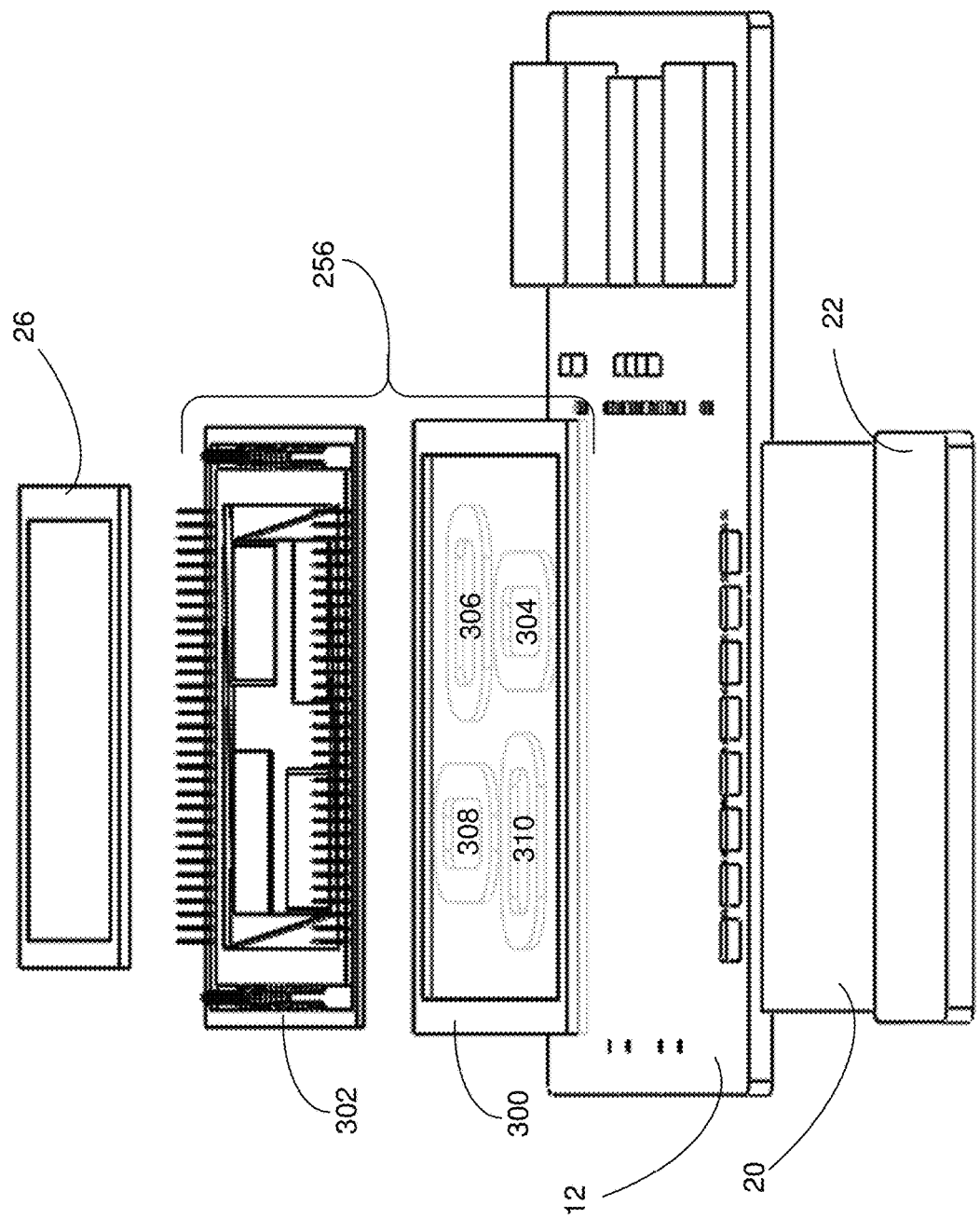

Accordingly and referring also to FIGS. 9-10, in-plane MEMS actuator 256 may be configured as a "hybrid" actuator in that it may include an electromagnetic actuator portion (e.g., electromagnetic actuator portion 300) in addition to (or as a substitute for) a MEMS portion (e.g., MEMS portion 302). Electromagnetic actuator portion 300 may include at least one magnetic assembly (e.g., magnetic assemblies 304, 306, 308, 310). The quantity of magnetic assemblies included within electromagnetic actuator portion 300 may vary depending upon various design criteria. For example, the quantity of magnetic assemblies included within electromagnetic actuator portion 300 may vary depending upon the number of axes in which liner movement is required of the actuator in question.

As in known in the art, the strength of a magnetic field (and, therefore, the strength of a magnetic force) generated by a magnetic assembly (e.g., magnetic assemblies 304, 306, 308, 310) may be varied by controlling the level of current applied to the magnetic assemblies (e.g., magnetic assemblies 304, 306, 308, 310). Accordingly and by controlling such current (e.g., the strength and/or the direction), the amount of linear movement (e.g., with respect to the X-axis and the Y-axis) as well as the amount of rotation (e.g., with respect to the Z-axis) may be controlled. When configured as such a "hybrid" actuator, the MEMS portion (e.g., MEMS actuator portion 302) of the "hybrid" actuator may be configured to provide general structural stability & integrity (e.g., by providing the functionality of the various cantilever assemblies, such as cantilever assembly 108).

As discussed above, in-plane MEMS actuator 256 may be configured to provide one or more of linear X-axis movement, linear Y-axis movement and rotational Z-axis movement. As discussed above, in order to effectuate such movement via a purely MEMS-based actuator (e.g., as shown in FIG. 3), four MEMS-based motion stages (e.g., comb drive sectors 106, 250, 252, 254) may be utilized, wherein comb drive sectors 250, 254 may be positioned orthogonal with respect to comb drive sectors 106, 252.

In order to effectuate such linear X-axis movement, linear Y-axis movement and rotational Z-axis movement, various magnetic assemblies may be utilized. Accordingly, at least one magnetic assembly (e.g., one or more of magnetic assemblies 304, 306, 308, 310) may be configured to enable in-plane displacement of optoelectronic device 26. For example, electromagnetic actuator portion 300 may include four magnetic assemblies (e.g., magnetic assemblies 304, 306, 308, 310), wherein magnetic assemblies 306, 310 (and their respective magnetic poles) may be positioned orthogonal with respect to magnetic assemblies 304, 308 (and their respective magnetic poles). Accordingly and by controlling the current applied to the magnetic assemblies (e.g., one or more of magnetic assemblies 304, 306, 308, 310), the amount of linear movement (e.g., with respect to the X-axis and/or the Y-axis and/or the amount of rotation with respect to the Z-axis) may be controlled, thus enabling linear X-axis and/or Y-axis displacement (and rotational Z-axis displacement) of optoelectronic device 26.

MEMS portion 302 of in-plane MEMS actuator 256 may include a plurality of motions stages (e.g., motion stages 312, 314, 316, 318) that are configured to interact with the plurality of magnetic assemblies (e.g., magnetic assemblies 304, 306, 308, 310) included within electromagnetic actuator portion 300.

Specifically and in the embodiment shown in FIGS. 9-10:
motion stage 312 may be configured to interact with magnetic assembly 304;
motion stage 314 may be configured to interact with magnetic assembly 306;
motion stage 316 may be configured to interact with magnetic assembly 308; and
motion stage 318 may be configured to interact with magnetic assembly 310.

Figure 11:
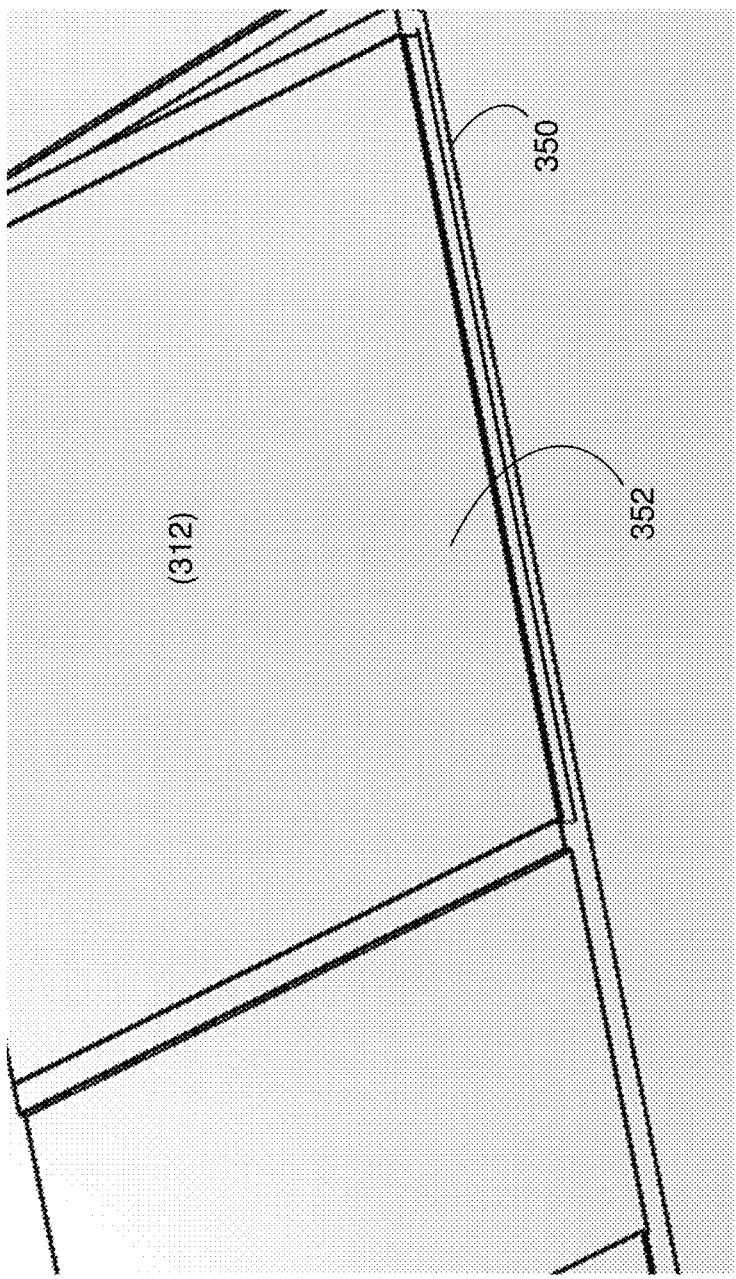
FIG. 11 is a detail view of a motion stage of the electromagnetic MEMS actuator of FIGS. 9-10 in accordance with various embodiments of the present disclosure.

Referring also to FIG. 11, there is shown a detail view of motion stage 312 of MEMS portion 302 of in-plane MEMS actuator 256, although it is understood that this is merely for illustrative purpose and may represent any motion stage.

MEMS portion 302 of in-plane MEMS actuator 256 may include: electrical flexures (e.g., electrically conductive flexures 32 of FIGS. 2A-2B); motion control flexures (e.g., motion control cantilever assemblies 150A, 150B of FIG. 4); motion transfer flexures (e.g., cantilever assembly 108 of FIG. 4); deposited magnets with different polarization sections (e.g., deposited magnetic structure 350); and deposited metallic layer (e.g., deposited metallic layer 352) positioned on (in this illustrative embodiment) deposited magnetic structure 350.

Polarized magnetic material/magnets (e.g., deposited magnetic structure 350) may be deposited (or glued) upon each motion stage (e.g., motion stages 312, 314, 316, 318) of MEMS portion 302 of in-plane MEMS actuator 256. A nickel/iron layer (e.g., deposited metallic layer 352) may be deposited (or glued) upon deposited magnetic structure 350, wherein the deposited magnetic structure (e.g., deposited magnetic structure 350) included in each of the motion stages (e.g., motion stage 312 in this example) may be arranged to have differing polarizations to effectuate the above-described X-axis movement, Y-axis movement and/or Z-axis rotation.

Figure 12:
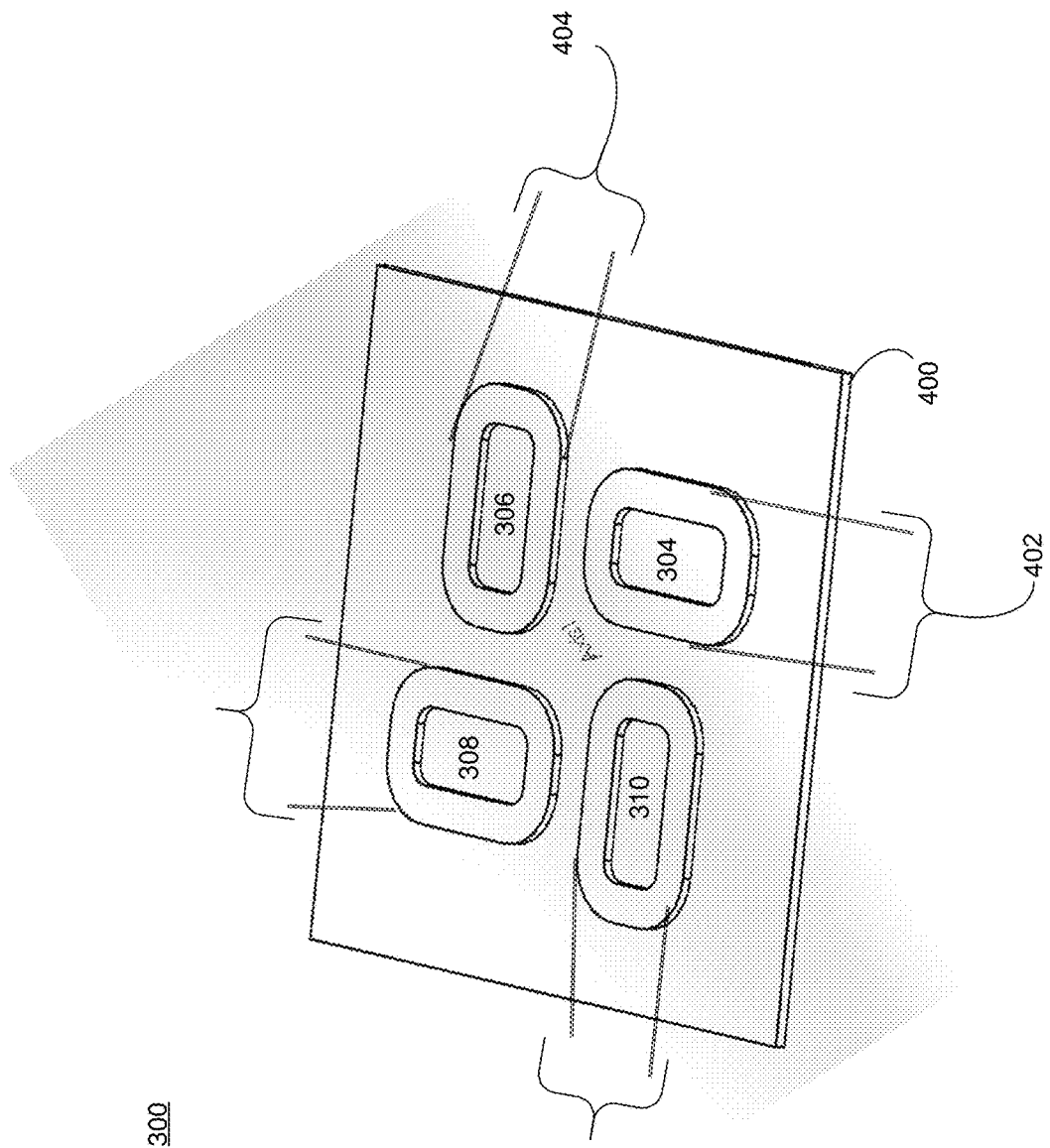
FIG. 12 is a detail view of an electromagnetic actuator portion of the electromagnetic MEMS actuator of FIGS. 9-10 in accordance with various embodiments of the present disclosure.

Referring also to FIG. 12, there is shown a detail view of electromagnetic actuator portion 300, which (in this illustrative embodiment) is shown to include four magnetic assemblies (e.g., magnetic assemblies 304, 306, 308, 310). Electromagnetic actuator portion 300 may include metallic plate assembly 400 to which the magnetic assemblies (e.g., magnetic assemblies 304, 306, 308, 310) are glued. The coil winding wires (e.g., winding wires 402, 404, 406, 408) for the magnetic assemblies (e.g., magnetic assemblies 304, 306, 308, 310 respectively) are electrically coupled to printed circuit board 12.

Figure 13:
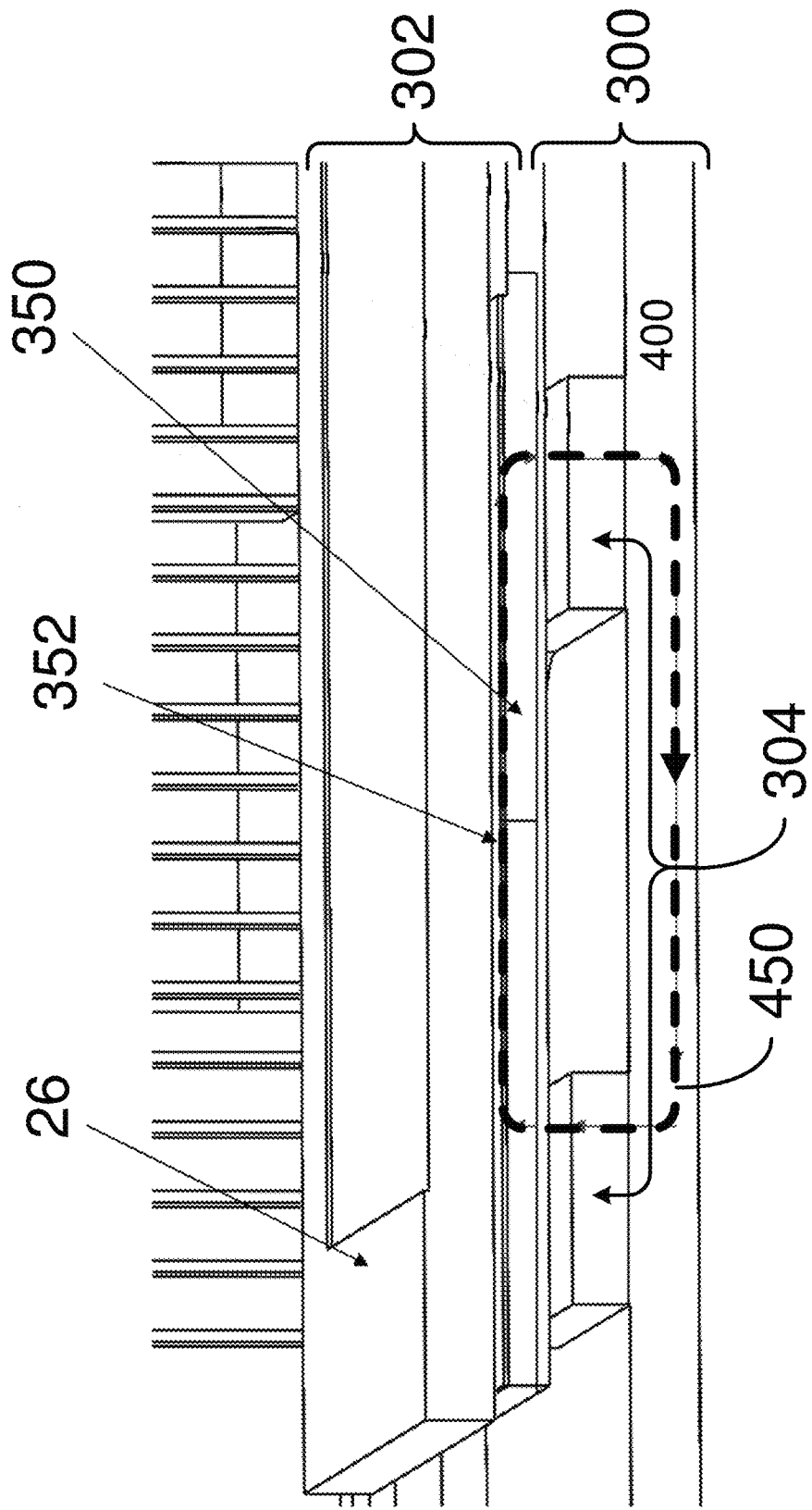
FIG. 13 is a cross-sectional view of the electromagnetic MEMS actuator of FIGS. 9-10 in accordance with various embodiments of the present disclosure.

Referring also to FIG. 13, there is shown a cross-sectional view of in-plane MEMS actuator 256, which includes electromagnetic actuator portion 300 and MEMS portion 302. Electromagnetic actuator portion 300 may include metallic plate assembly 400 and a plurality of magnetic assemblies (e.g., of which magnetic assembly 304 is shown). MEMS portion 302 may include deposited magnetic structure 350 and deposited metallic layer 352.

During operation of in-plane MEMS actuator 256, the current provided to the magnetic assemblies (e.g., magnetic assemblies 304, 306, 308, 310) of electromagnetic actuator portion 300 may generate magnetic field 450 that may interact with the magnetic material/magnets (e.g., deposited magnetic structure 350) within MEMS portion 302, resulting in the above-described X-axis movement, Y-axis movement and/or Z-axis rotation of optoelectronic device 26 (due to magnetic assemblies 304, 306, 308, 310 being rigidly affixed via metallic plate assembly 400.

Any heat generated by the magnetic assemblies (e.g., magnetic assemblies 304, 306, 308, 310) may be conducted downward (e.g., to printed circuit board 12 via metallic plate assembly 400, which may function as a heat sink).

Locking Assembly:

As discussed above, micro-electrical-mechanical system (MEMS) actuator 24 may include an in-plane MEMS actuator (e.g., in-plane MEMS actuator 256) and an out-of-plane MEMS actuator (e.g., out-of-plane MEMS actuator 258). Further and as discussed above, in-plane MEMS actuator 256 may be configured to provide linear X-axis movement and linear Y-axis movement and out-of-plane MEMS actuator 258 may be configured to provide linear Z-axis movement.

As could be imagined, in the event that the device containing micro-electrical-mechanical system (MEMS) actuator 24 is dropped and/or experiences an impact, one or more of the above-described components of micro-electrical-mechanical system (MEMS) actuator 24 may be damaged when e.g., a moveable portion of micro-electrical-mechanical system (MEMS) actuator 24 impacts a non-moveable portion of micro-electrical-mechanical system (MEMS) actuator 24. Accordingly and in order to reduce the likelihood of such impact-related damage, micro-electrical-mechanical system (MEMS) actuator 24 may be configured to include a locking assembly.

Figure 14:
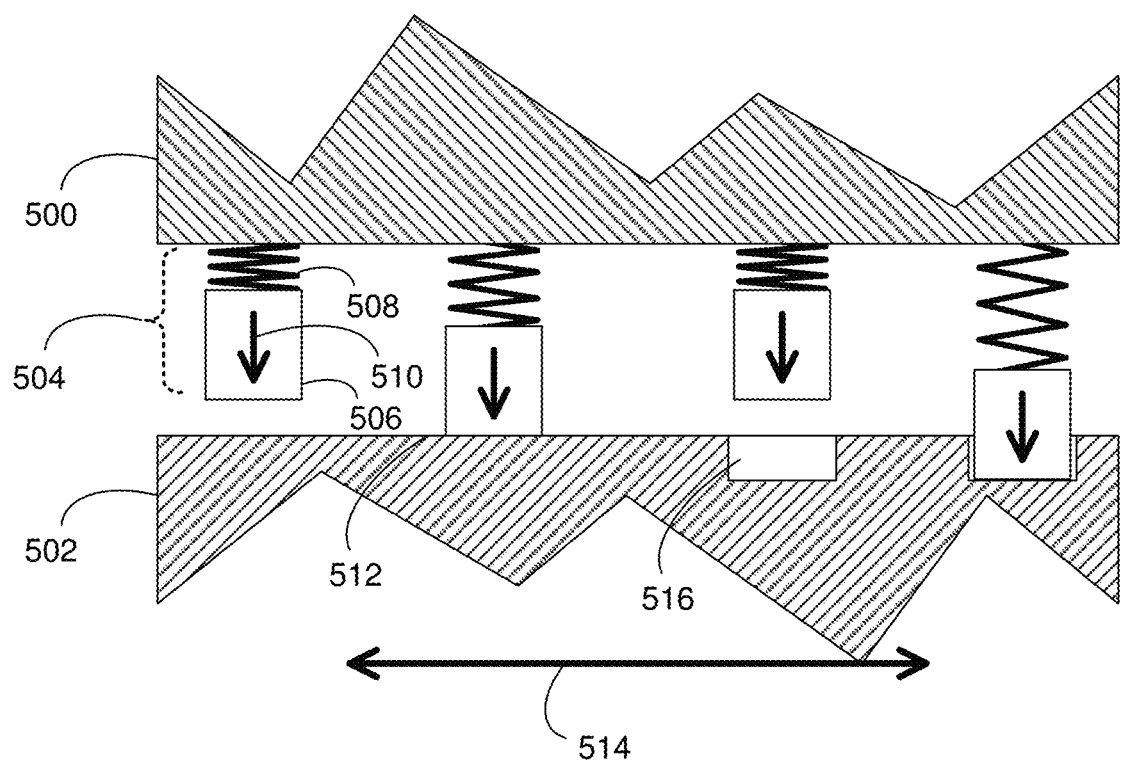
FIG. 14 is a diagrammatic view of a locking assembly in accordance with various embodiments of the present disclosure.

As discussed above and referring also to FIG. 14, micro-electrical-mechanical system (MEMS) actuator 24 may be configured to provide multi-axis movement (e.g., X-axis, Y-axis and/or Z-axis movement), wherein micro-electrical-mechanical system (MEMS) actuator 24 may include a first portion (e.g., first portion 500) and a second portion (e.g., second portion 502), wherein first portion 500 and second portion 552 are displaceable with respect to each other. For example, one of first portion 500 or second portion 502 may be a fixed portion of micro-electrical-mechanical system (MEMS) actuator 24 and the other of first portion 500 or second portion 502 may be a moveable portion of micro-electrical-mechanical system (MEMS) actuator 24

Examples of a fixed portion of micro-electrical-mechanical system (MEMS) actuator 24 may include but are not limited to: outer frame 30 of micro-electrical-mechanical system (MEMS) actuator 24. Examples of a moveable portion of micro-electrical-mechanical system (MEMS) actuator 24 may include but are not limited to MEMS actuation core 34 of micro-electrical-mechanical system (MEMS) actuator 24 (which may be configured to provide X-axis and/or Y-axis movement) and/or moveable stage 262 of micro-electrical-mechanical system (MEMS) actuator 24 (which may be configured to provide Z-axis movement).

A locking assembly (e.g., locking assembly 504) may be configured to releasably couple first portion 500 and second portion 502 to attenuate displacement between first portion 500 and second portion 502. Locking assembly 504 may include engagement assembly 506 and actuator assembly 508, wherein actuator assembly 508 may be coupled to first portion 500 and may be configured to displace engagement assembly 506 (in the direction of arrow 510) so that engagement assembly 506 releasably engages second portion 502. Accordingly, locking assembly 504 may be configured to: attenuate displacement between e.g., MEMS actuation core 34 (i.e., a moveable portion) and outer frame 30 (i.e., a fixed portion) when configured to attenuate X-axis and/or Y-axis movement; attenuate displacement between e.g., moveable stage 262 (i.e., a moveable portion) and outer frame 30 (i.e., a fixed portion) when configured to attenuate Z-axis movement; and/or attenuate displacement between e.g., the combination of MEMS actuation core 34/moveable stage 262 (i.e., a moveable portion) and outer frame 30 (i.e., a fixed portion) when configured to attenuate X-axis, Y-axis and Z-axis movement).

Examples of actuator assembly 508 may include but are not limited to: a comb drive actuator (as described above), a piezoelectric actuator (as described above) and a zipper actuator.

Figure 15:
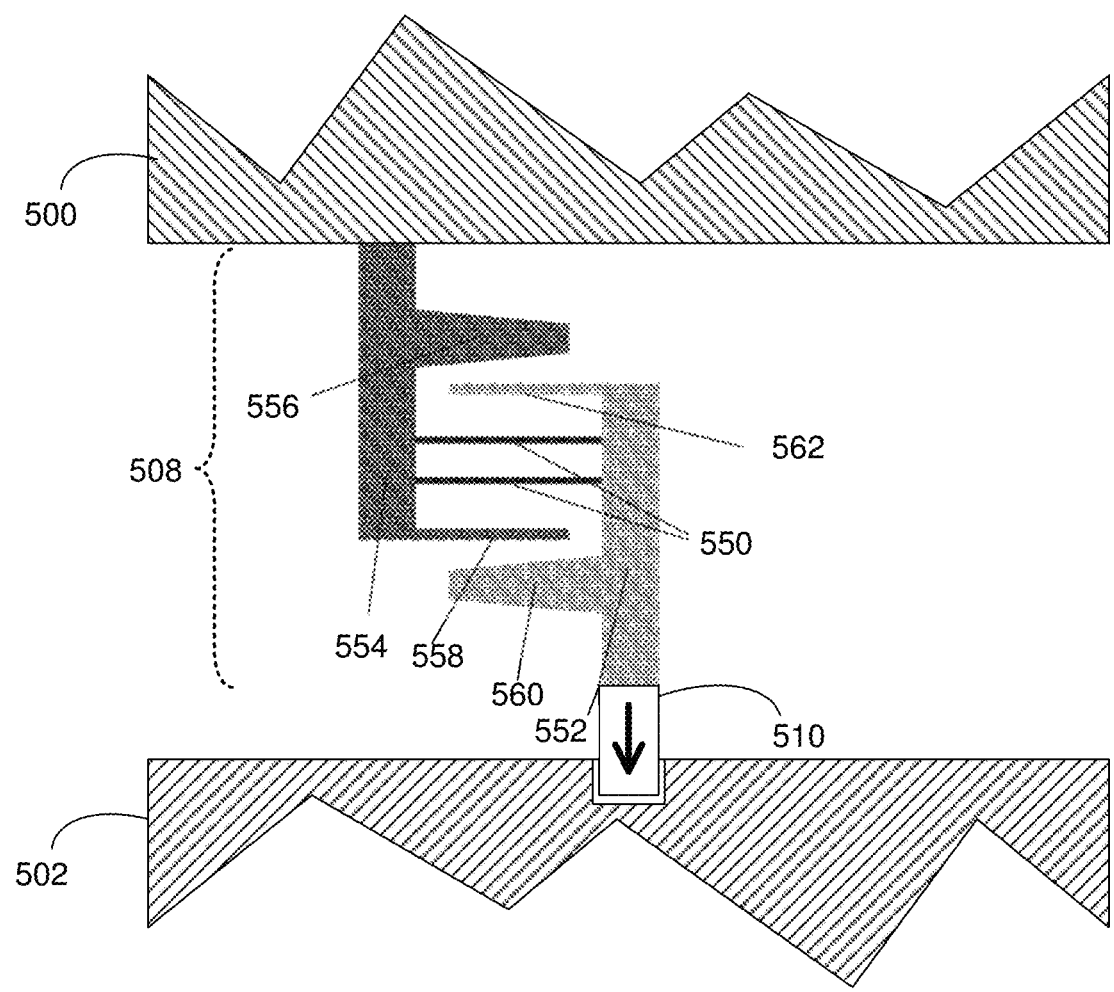
FIG. 15 is another diagrammatic view of a locking assembly in accordance with various embodiments of the present disclosure.

Referring also to FIG. 15, there is shown one possible implementation of actuator assembly 508 that includes a zipper actuator. Actuator assembly 508 may include parallel motion beams 550 that couple and position moveable stage 552 and fixed stage 554. Actuator assembly 508 may include various electrodes, examples of which may include but are not limited to rigid fixed electrode 556 and flexible fixed electrode 558 (both coupled to fixed stage 554); and rigid moveable electrode 560 and flexible moveable electrode 562 (both coupled to fixed stage 552). Applying a voltage potential across electrode pairs (e.g., fixed electrode 556/flexible moveable electrode 562 and rigid moveable electrode 560/flexible fixed electrode 558 may displace moveable stage 552 with respect to fixed stage 554.

Accordingly, engagement assembly 506 may be configured to engage a surface (e.g., surface 512) of second portion 502 so that frictional force between engagement assembly 506 and surface 512 of second portion 502 attenuate displacement (in the direction of arrow 514) between first portion 500 and second portion 502.

Additionally/alternatively, engagement assembly 506 may be configured to engage a recess (e.g., recess 516) of second portion 502 so that direct contact between engagement assembly 506 and recess 516 of second portion 502 attenuate displacement (in the direction of arrow 514) between first portion 500 and second portion 502.

Coupled Actuators:

As discussed above, multi-axis MEMS assembly 14 may include micro-electrical-mechanical system (MEMS) actuator 24 and optoelectronic device 26 may be coupled to micro-electrical-mechanical system (MEMS) actuator 24. As also discussed above, examples of micro-electrical-mechanical system (MEMS) actuator 24 may include but are not limited to in-plane MEMS actuators, out-of-plane MEMS actuators, and combination in-plane/out-of-plane MEMS actuators, wherein these MEMS actuators may be configured to utilize electrostatic actuation, piezoelectric actuation and electromagnetic actuation.

As will be discussed below in greater detail, multiple MEMS actuators (be it electrostatically-actuated, piezoelectrically-actuated or electromagnetically-actuated) may be coupled together to provide e.g., the desired level of movement and/or actuation force.

Figure 16A:
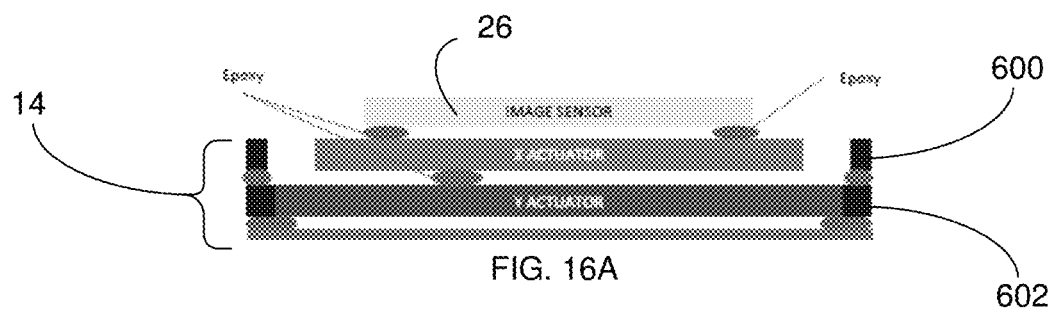
FIGS. 16A-16C are diagrammatic views of a stacked, single-axis MEMS actuator.
Figure 16B:
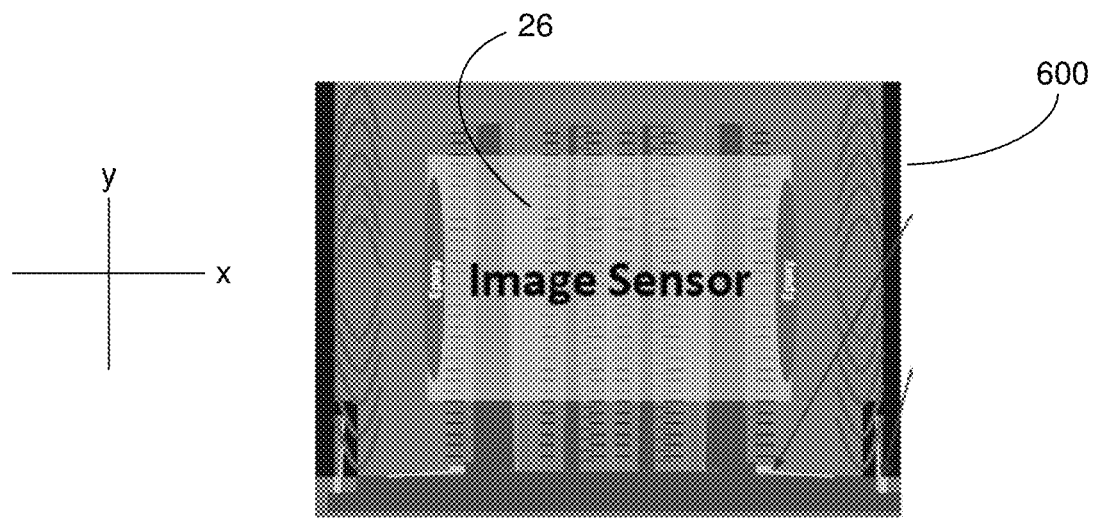
Figure 16C:
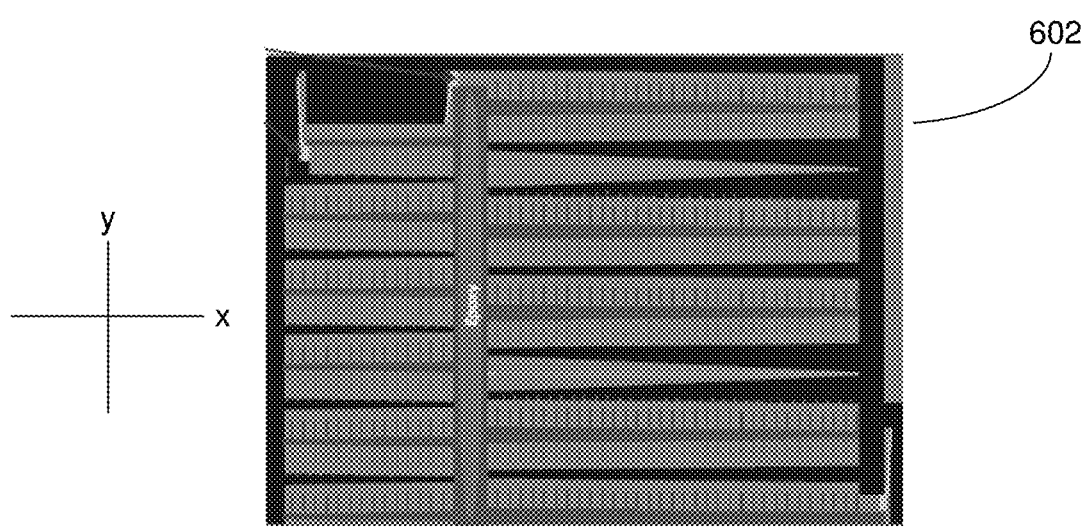

Stacked Single-Axis MEMS Actuators:

Referring also to FIGS. 16A, 16B & 16C, there is shown one implementation of a multi-axis MEMS assembly (e.g., multi-axis MEMS assembly 14) that includes a plurality of "stacked" MEMS actuators (i.e., MEMS actuators that are coupled together by positioning one MEMS actuator on top of another MEMS actuator).

In this particular configuration, multi-axis MEMS assembly 14 is shown to include: first in-plane MEMS actuator 600 configured to enable movement along at least an X-axis and second in-plane MEMS actuator 602 configured to enable movement along at least a Y-axis, wherein first in-plane MEMS actuator 600 is positioned on top of and coupled to second in-plane MEMS actuator 602 via (in this particular implementation) an epoxy.

An optoelectronic device (e.g., optoelectronic device 26) may be coupled to one of first in-plane MEMS actuator 600 and second in-plane MEMS actuator 602. Accordingly, movement of optoelectronic device 26 in both the X-axis and the Y-axis may be accomplished by coupling optoelectronic device 26 to one of first in-plane MEMS actuator 600 and second in-plane MEMS actuator 602; and interconnecting first in-plane MEMS actuator 600 and second in-plane MEMS actuator 602 by coupling (e.g., via epoxy) the various moveable portions and fixed portions contained therein (as described above).

While in this particular configuration, optoelectronic device 26 is shown to be coupled to first in-plane MEMS actuator 600, this is for illustrative purposes only and is not intended to be a limitation of this disclosure, as other configurations are possible and are considered to be within the scope of this disclosure. For example, optoelectronic device 26 may be coupled to second in-plane MEMS actuator 602.

Additionally and in this particular configuration, first in-plane MEMS actuator 600 and second in-plane MEMS actuator 602 are single-axis actuators that are each configured to provide movement in only a single axis. For example and in this particular configuration, first in-plane MEMS actuator 600 is configured to enable movement in only the X-axis while second in-plane MEMS actuator 602 is configured to enable movement in only the Y-axis. However, the combination of first in-plane MEMS actuator 600 and second in-plane MEMS actuator 602 may enable XY movement of optoelectronic device 26. Accordingly and in such a configuration, at least one of first in-plane MEMS actuator 600 and second in-plane MEMS actuator 602 may be an image stabilization actuator (as described above).

While in this particular configuration, multi-axis MEMS assembly 14 is shown to include two in-plane MEMS actuators (i.e., in-plane MEMS actuator 600 configured to enable movement in only the X-axis and in-plane MEMS actuator 602 configured to enable movement in only the Y-axis), this is for illustrative purposes only and is not intended to be a limitation of this disclosure, as other configurations are possible and are considered to be within the scope of this disclosure. For example, additional MEMS actuators (providing movement in either the X-axis or the Y-axis) may be included within multi-axis MEMS assembly 14 to provide greater actuation force (when configured in a parallel arrangement) or greater actuation travel (when configured in a series arrangement).

Additionally and as discussed above, multi-axis MEMS assembly 14 may include one or more out-of-plane MEMS actuators (e.g., such as those shown in FIGS. 7A, 7B, 7C) to allow for out-of-plane (i.e., Z-axis) movement of optoelectronic device (e.g., optoelectronic device 26).

While in this particular configuration, first in-plane MEMS actuator 600 is configured to enable movement in only the X-axis and is shown positioned on top of second in-plane MEMS actuator 602 (which is configured to enable movement in only the Y-axis), this is for illustrative purposes only and is not intended to be a limitation of this disclosure, as other configurations are possible and are considered to be within the scope of this disclosure. For example, first in-plane MEMS actuator 600 (which may be configured to enable movement in only the X-axis) may be positioned below second in-plane MEMS actuator 602 (which may be configured to enable movement in only the Y-axis).

As discussed above, MEMS actuators may be configured to utilize electrostatic actuation, piezoelectric actuation and electromagnetic actuation. Accordingly, at least one of first in-plane MEMS actuator 600 and second in-plane MEMS actuator 602 may be:
- an electrostatic MEMS actuator (as shown in FIGS. 3-6);
- a piezoelectric MEMS actuator (as shown in FIG. 7A, 7B, 7C, 7D); and
- an electromagnetic MEMS actuator (as shown in FIGS. 9-13).

Figure 17A:
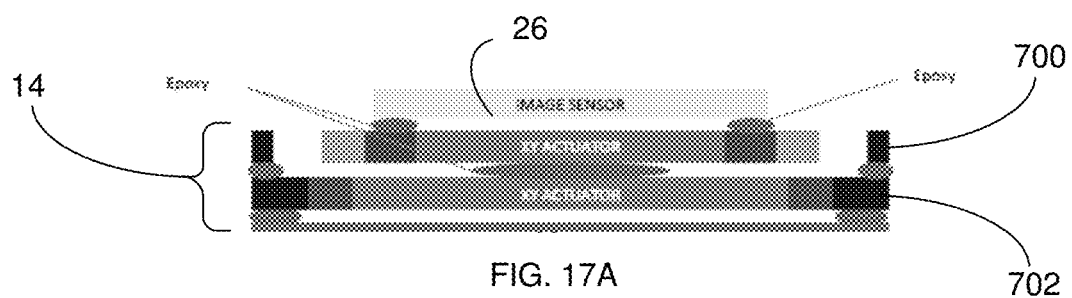
FIGS. 17A-17C are diagrammatic views of a stacked, multi-axis MEMS actuator.
Figure 17B:
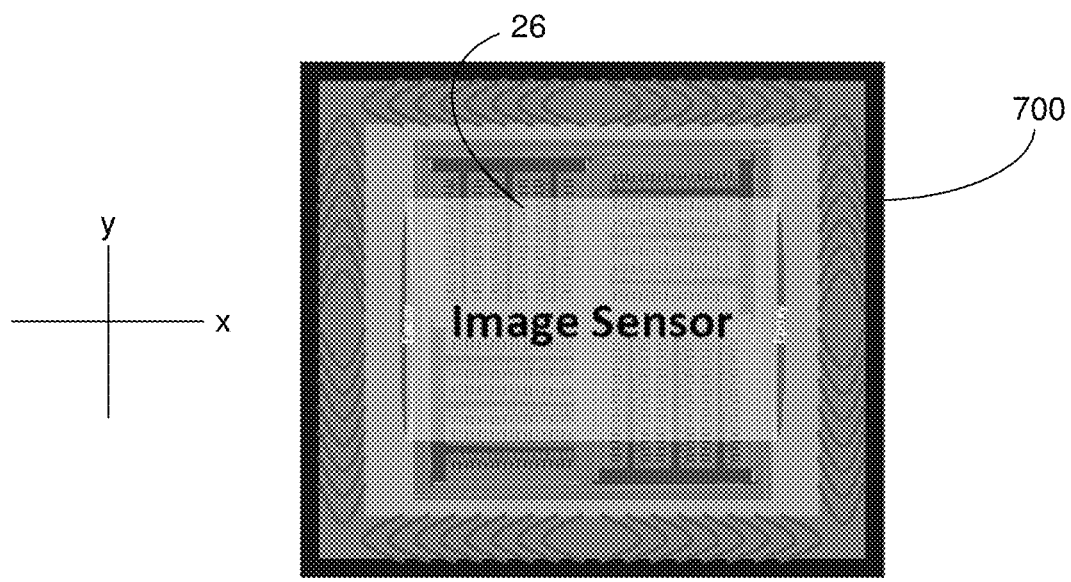
Figure 17C:
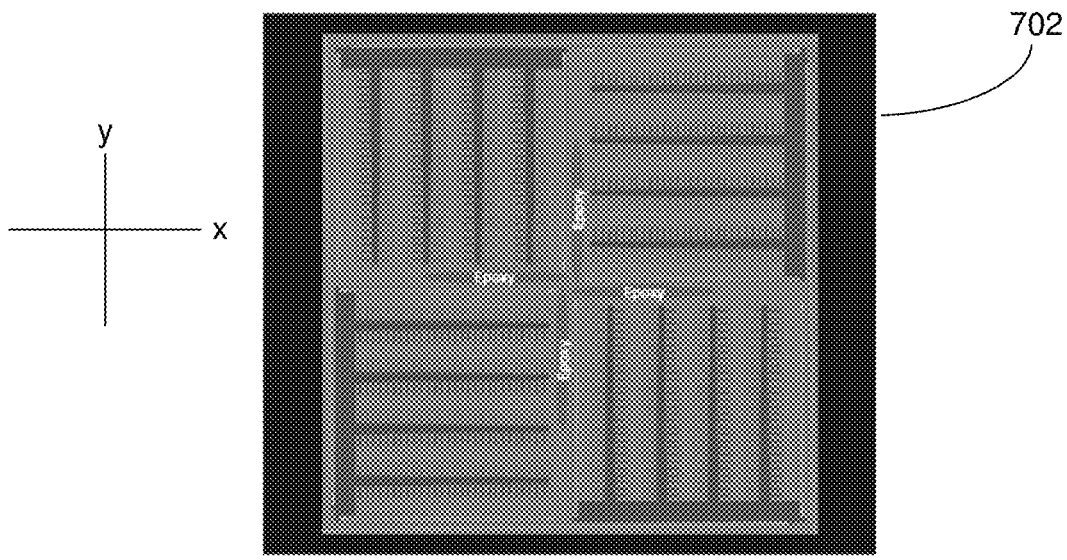

Stacked Multi-Axis MEMS Actuators:

Referring also to FIGS. 17A, 17B & 17C, there is shown another implementation of a multi-axis MEMS assembly (e.g., multi-axis MEMS assembly 14) that includes a plurality of "stacked" MEMS actuators (i.e., MEMS actuators that are coupled together by positioning one MEMS actuator on top of another MEMS actuator).

In this particular configuration, multi-axis MEMS assembly 14 is shown to include: first in-plane MEMS actuator 700 configured to enable movement along at least an X-axis and second in-plane MEMS actuator 702 configured to enable movement along at least a Y-axis, wherein first in-plane MEMS actuator 700 is positioned on top of and coupled to second in-plane MEMS actuator 702 via (in this particular implementation) an epoxy.

An optoelectronic device (e.g., optoelectronic device 26) may be coupled to one of first in-plane MEMS actuator 700 and second in-plane MEMS actuator 702. Accordingly, movement of optoelectronic device 26 in both the X-axis and the Y-axis may be accomplished by coupling optoelectronic device 26 to one of first in-plane MEMS actuator 700 and second in-plane MEMS actuator 702; and interconnecting first in-plane MEMS actuator 700 and second in-plane MEMS actuator 702 by coupling (e.g., via epoxy) the various moveable portions and fixed portions contained therein (as described above).

While in this particular configuration, optoelectronic device 26 is shown to be coupled to first in-plane MEMS actuator 700, this is for illustrative purposes only and is not intended to be a limitation of this disclosure, as other configurations are possible and are considered to be within the scope of this disclosure. For example, optoelectronic device 26 may be coupled to second in-plane MEMS actuator 702.

Additionally and in this particular configuration, first in-plane MEMS actuator 700 and second in-plane MEMS actuator 702 are multi-axis actuators that are each configured to provide movement in multiple axes. For example and in this particular configuration, first in-plane MEMS actuator 700 is configured to enable movement in both the X-axis & the Y-axis while second in-plane MEMS actuator 702 is configured to enable movement in both the X-axis & the Y-axis, thus enabling XY movement of optoelectronic device 26. Accordingly and in such a configuration, at least one of first in-plane MEMS actuator 700 and second in-plane MEMS actuator 702 may be an image stabilization actuator (as described above).

While in this particular configuration, first in-plane MEMS actuator 700 is shown positioned on top of second in-plane MEMS actuator 702, this is for illustrative purposes only and is not intended to be a limitation of this disclosure, as other configurations are possible and are considered to be within the scope of this disclosure. For example, first in-plane MEMS actuator 700 may be positioned below second in-plane MEMS actuator 702.

While in this particular configuration, multi-axis MEMS assembly 14 is shown to include two in-plane MEMS actuators (i.e., in-plane MEMS actuator 700 and in-plane MEMS actuator 702), this is for illustrative purposes only and is not intended to be a limitation of this disclosure, as other configurations are possible and are considered to be within the scope of this disclosure. For example, additional MEMS actuators (providing movement in either the X-axis, the Y-axis or the X&Y axes) may be included within multi-axis MEMS assembly 14 to provide greater actuation force (when configured in a parallel arrangement) or greater actuation travel (when configured in a series arrangement).

Additionally and as discussed above, multi-axis MEMS assembly 14 may include one or more out-of-plane MEMS actuators (e.g., such as those shown in FIGS. 7A, 7B, 7C) to allow for out-of-plane (i.e., Z-axis) movement of optoelectronic device (e.g., optoelectronic device 26).

While in this particular configuration, first in-plane MEMS actuator 700 and second in-plane MEMS actuator 702 are multi-axis actuators that are each configured to provide movement in multiple axes, this is for illustrative purposes only and is not intended to be a limitation of this disclosure, as other configurations are possible and are considered to be within the scope of this disclosure. For example, one of first in-plane MEMS actuator 700 and second in-plane MEMS actuator 702 may be a single-axis actuator that is configured to provide movement in a single axis (e.g., the X-axis or the Y-axis).

As discussed above, MEMS actuators may be configured to utilize electrostatic actuation, piezoelectric actuation and electromagnetic actuation. Accordingly, at least one of first in-plane MEMS actuator 700 and second in-plane MEMS actuator 702 may be:

an electrostatic MEMS actuator (as shown in FIGS. 3-6);
a piezoelectric MEMS actuator (as shown in FIG. 7A, 7B, 7C, 7D); and
an electromagnetic MEMS actuator (as shown in FIGS. 9-13).

Figure 18:
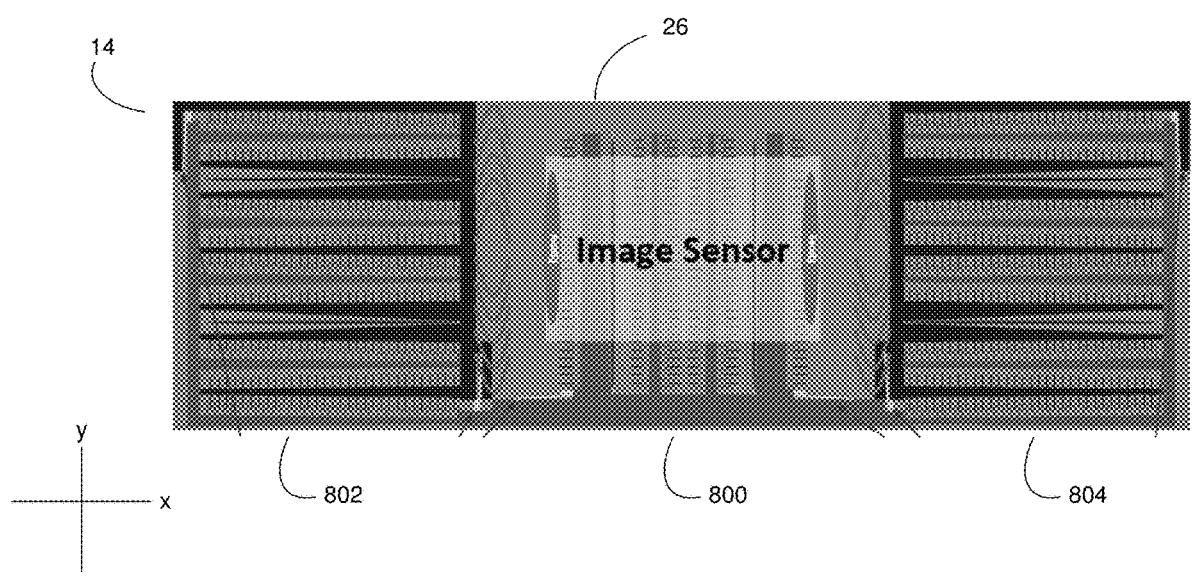
FIG. 18 is a diagrammatic view of a cascaded MEMS actuator.

Cascaded MEMS Actuators:

Referring also to FIG. 18, there is shown another implementation of a multi-axis MEMS assembly (e.g., multi-axis MEMS assembly 14) that includes a plurality of "cascaded" MEMS actuators (i.e., MEMS actuators that are coupled together by positioning one MEMS actuator next to another MEMS actuator).

In this particular configuration, multi-axis MEMS assembly 14 is shown to include: first in-plane MEMS actuator 800 configured to enable movement along at least an X-axis and second in-plane MEMS actuator 802 configured to enable movement along at least a Y-axis. Additionally, multi-axis MEMS assembly 14 is shown to include third in-plane MEMS actuator 804 configured to enable movement along at least a Y-axis.

In this particular configuration, first in-plane MEMS actuator 800 is configured to enable movement along at least an X-axis and is positioned between second in-plane MEMS actuator 802 and third in-plane MEMS actuator 804 (each of which is configured to enable movement along at least a Y-axis).

While in this particular configuration, MEMS actuators 800, 802, 804 are described as each being configured to enable movement along a single axis, this is for illustrative purposes only and is not intended to be a limitation of this disclosure, as other configurations are possible and are considered to be within the scope of this disclosure. For example, one or more of MEMS actuators 800, 802, 804 may be configured to enable movement along multiple axes.

An optoelectronic device (e.g., optoelectronic device 26) may be coupled to one of MEMS actuators 800, 802, 804. Accordingly, movement of optoelectronic device 26 in both the X-axis and the Y-axis may be accomplished by coupling optoelectronic device 26 to one of first in-plane MEMS actuator 800, second in-plane MEMS actuator 802 or third in-plane MEMS actuator 804; and interconnecting first in-plane MEMS actuator 800, second in-plane MEMS actuator 802 and third in-plane MEMS actuator 804 by coupling (e.g., via epoxy) the various moveable portions and fixed portions contained therein (as described above).

While in this particular configuration, optoelectronic device 26 is shown to be coupled to first in-plane MEMS actuator 802, this is for illustrative purposes only and is not intended to be a limitation of this disclosure, as other configurations are possible and are considered to be within the scope of this disclosure. For example, optoelectronic device 26 may be coupled to second in-plane MEMS actuator 802 or third in-plane MEMS actuator 804.

Additionally and in this particular configuration, first in-plane MEMS actuator 800, second in-plane MEMS actuator 802 and third in-plane MEMS actuator 804 are single-axis actuators that are each configured to provide movement in only a single axis. For example and in this particular configuration, first in-plane MEMS actuator 800 is configured to enable movement in only the X-axis while second in-plane MEMS actuator 802 and third in-plane MEMS actuator 804 are configured to enable movement in only the Y-axis. However, the combination of first in-plane MEMS actuator 800, second in-plane MEMS actuator 802 and third in-plane MEMS actuator 804 may enable XY movement of optoelectronic device 26. Accordingly and in such a configuration, at least one of first in-plane MEMS actuator 800, second in-plane MEMS actuator 802 and third in-plane MEMS actuator 804 may be an image stabilization actuator (as described above).

While in this particular configuration, first in-plane MEMS actuator 800 is configured to enable movement in only the X-axis and is shown positioned between second in-plane MEMS actuator 802 and third in-plane MEMS actuator 804 (each of which are configured to enable movement in only the Y-axis), this is for illustrative purposes only and is not intended to be a limitation of this disclosure, as other configurations are possible and are considered to be within the scope of this disclosure. For example, an in-plane MEMS actuator that is configured to enable movement in only the Y-axis may be positioned between two in-plane MEMS actuators that are configured to enable movement in only the X-axis.

While in this particular configuration, multi-axis MEMS assembly 14 is shown to include three MEMS actuators (i.e., MEMS actuators 800, 802, 804), this is for illustrative purposes only and is not intended to be a limitation of this disclosure, as other configurations are possible and are considered to be within the scope of this disclosure. For example, additional MEMS actuators (providing movement in either the X-axis, the Y-axis or the X&Y axes) may be included within multi-axis MEMS assembly 14 to provide greater actuation force (when configured in a parallel arrangement) or greater actuation travel (when configured in a series arrangement).

Additionally and as discussed above, multi-axis MEMS assembly 14 may include one or more out-of-plane MEMS actuators (e.g., such as those shown in FIGS. 7A, 7B, 7C) to allow for out-of-plane (i.e., Z-axis) movement of optoelectronic device (e.g., optoelectronic device 26).

As discussed above, MEMS actuators may be configured to utilize electrostatic actuation, piezoelectric actuation and electromagnetic actuation. Accordingly, at least one of first in-plane MEMS actuator 800, second in-plane MEMS actuator 802 and third in-plane MEMS actuator 804 may be:
- an electrostatic MEMS actuator (as shown in FIGS. 3-6);
- a piezoelectric MEMS actuator (as shown in 7A, 7B, 7C, FIG. 7D); and
- an electromagnetic MEMS actuator (as shown in FIGS. 9-13).

General:

In general, the various operations of method described herein may be accomplished using or may pertain to components or features of the various systems and/or apparatus with their respective components and subcomponents, described herein.

The presence of broadening words and phrases such as "one or more," "at least," "but not limited to" or other like phrases in some instances shall not be read to mean that the narrower case is intended or required in instances where such broadening phrases may be absent.

Additionally, the various embodiments set forth herein are described in terms of example block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

While various embodiments of the present disclosure have been described above, it should be understood that they have been presented by way of example only, and not of limitation. Likewise, the various diagrams may depict an example architectural or other configuration for the disclosure, which is done to aid in understanding the features and functionality that can be included in the disclosure. The disclosure is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present disclosure. Additionally, with regard to flow diagrams, operational descriptions and method claims, the order in which the steps are presented herein shall not mandate that various embodiments be implemented to perform the recited functionality in the same order unless the context dictates otherwise.

Although the disclosure is described above in terms of various example embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosure, whether or not such embodiments are described and whether or not such features are presented as being a part of a described embodiment. Thus, the breadth and scope of the present disclosure should not be limited by any of the above-described example embodiments, and it will be understood by those skilled in the art that various changes and modifications to the previous descriptions may be made within the scope of the claims.

As will be appreciated by one skilled in the art, the present disclosure may be embodied as a method, a system, or a computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. The computer-usable or computer-readable medium may also be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to the Internet, wireline, optical fiber cable, RF, etc.

Computer program code for carrying out operations of the present disclosure may be written in an object oriented programming language such as Java, Smalltalk, C++ or the like. However, the computer program code for carrying out operations of the present disclosure may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network/a wide area network/the Internet (e.g., network 18).

The present disclosure is described with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer/special purpose computer/other programmable data processing apparatus, such that the instructions, which execute via the processor of the computer or other programmable data processing apparatus, create means for implementing the functions/acts specified in the flowchart and/or block diagram block or blocks.

These computer program instructions may also be stored in a computer-readable memory that may direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

The flowcharts and block diagrams in the figures may illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A multi-axis MEMS assembly configured to provide multi-axis movement, the multi-axis MEMS assembly comprising:
    a first in-plane MEMS actuator configured to enable movement along at least an X-axis; and
    a second in-plane MEMS actuator configured to enable movement along at least a Y-axis;
    wherein the first in-plane MEMS actuator is interconnected with the second in-plane MEMS actuator in a Z-axis by coupling moveable portions and fixed portions contained within the first in-plane MEMS actuator and the second in-plane MEMS actuator.

2. The multi-axis MEMS assembly of claim 1 wherein the first in-plane MEMS actuator is also configured to enable movement along the Y-axis.

3. The multi-axis MEMS assembly of claim 1 wherein the second in-plane MEMS actuator is also configured to enable movement along the X-axis.

4. The multi-axis MEMS assembly of claim 1 wherein the first in-plane MEMS actuator and the second in-plane MEMS actuator form a stacked multi-axis micro-electrical-mechanical system (MEMS) actuator.

5. The multi-axis MEMS assembly of claim 4 wherein one of the first in-plane MEMS actuator and the second in-plane MEMS actuator is positioned on top of the other of the first in-plane MEMS actuator and the second in-plane MEMS actuator.

6. The multi-axis MEMS assembly of claim 1 wherein the first in-plane MEMS actuator and the second in-plane MEMS actuator form a cascaded multi-axis micro-electrical-mechanical system (MEMS) actuator.

7. The multi-axis MEMS assembly of claim 6 wherein one of the first in-plane MEMS actuator and the second in-plane MEMS actuator is positioned next to the other of the first in-plane MEMS actuator and the second in-plane MEMS actuator.

8. The multi-axis MEMS assembly of claim 1 wherein at least one of the first in-plane MEMS actuator and the second in-plane MEMS actuator is an electrostatic MEMS actuator.

9. The multi-axis MEMS assembly of claim 1 wherein at least one of the first in-plane MEMS actuator and the second in-plane MEMS actuator is an electromagnetic MEMS actuator.

10. The multi-axis MEMS assembly of claim 1 wherein at least one of the first in-plane MEMS actuator and the second in-plane MEMS actuator is a piezoelectric MEMS actuator.

11. The multi-axis MEMS assembly of claim 1 wherein at least one of the first in-plane MEMS actuator and the second in-plane MEMS actuator is an image stabilization actuator.

12. The multi-axis MEMS assembly of claim 1 further comprising:
    an optoelectronic device coupled to one of the first in-plane MEMS actuator and the second in-plane MEMS actuator.

13. A multi-axis MEMS assembly configured to provide multi-axis movement, the multi-axis MEMS assembly comprising:
    a first in-plane MEMS actuator configured to enable movement along at least an X-axis;

a second in-plane MEMS actuator configured to enable movement along at least a Y-axis; and an optoelectronic device coupled to one of the first in-plane MEMS actuator and the second in-plane MEMS actuator;

wherein the first in-plane MEMS actuator is interconnected with the second in-plane MEMS actuator in a Z-axis by coupling moveable portions and fixed portions contained within the first in-plane MEMS actuator and the second in-plane MEMS actuator; and wherein the first in-plane MEMS actuator and the second in-plane MEMS actuator form a stacked multi-axis micro-electrical-mechanical system (MEMS) actuator.

14. The multi-axis MEMS assembly of claim 13 wherein at least one of the first in-plane MEMS actuator and the second in-plane MEMS actuator is an electrostatic MEMS actuator.

15. The multi-axis MEMS assembly of claim 13 wherein at least one of the first in-plane MEMS actuator and the second in-plane MEMS actuator is an electromagnetic MEMS actuator.

16. The multi-axis MEMS assembly of claim 13 wherein at least one of the first in-plane MEMS actuator and the second in-plane MEMS actuator is a piezoelectric MEMS actuator.

* * * * *